United States Patent
Kobayashi et al.

(10) Patent No.: US 6,515,934 B2
(45) Date of Patent: Feb. 4, 2003

(54) SEMICONDUCTOR DEVICE INCLUDING INTERNAL POTENTIAL GENERATING CIRCUIT ALLOWING TUNING IN SHORT PERIOD OF TIME AND REDUCTION OF CHIP AREA

(75) Inventors: Mako Kobayashi, Hyogo (JP); Fukashi Morishita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,973

(22) Filed: Nov. 13, 2001

(65) Prior Publication Data
US 2002/0064077 A1 May 30, 2002

Related U.S. Application Data

(63) Continuation-in-part of application No. 09/489,474, filed on Jan. 21, 2000, now Pat. No. 6,331,962.

(30) Foreign Application Priority Data

Jul. 26, 1999 (JP) .............................. 11-211029

(51) Int. Cl.[7] ................................. G11C 7/00
(52) U.S. Cl. ............. 365/226; 365/189.09; 365/189.07; 365/189.11
(58) Field of Search ................ 365/226, 227, 365/189.07, 189.09, 189.11

(56) References Cited

U.S. PATENT DOCUMENTS

| 5,398,207 A | 3/1995 | Tsuchida et al. |
| 5,434,498 A | 7/1995 | Cordoba et al. |
| 5,451,896 A | 9/1995 | Mori |
| 5,631,862 A | 5/1997 | Cutter et al. |
| 5,864,225 A | 1/1999 | Bryson |
| 5,901,102 A * | 5/1999 | Furutan ................. 365/226 |
| 5,986,959 A * | 11/1999 | Itou ..................... 365/226 |
| 6,043,638 A | 3/2000 | Tobita |
| 6,087,885 A | 7/2000 | Tobita |
| 6,229,753 B1 * | 5/2001 | Kono et al. ............ 365/230.03 |
| 6,331,962 B1 * | 12/2001 | Kobayashi et al. ......... 365/226 |
| 6,335,893 B1 * | 1/2002 | Tanaka et al. ............ 365/226 |
| 2002/0000582 A1 * | 1/2002 | Kobayashi et al. ......... 365/226 |
| 2002/0024330 A1 * | 2/2002 | Hosogane et al. .......... 323/317 |
| 2002/0064077 A1 * | 5/2002 | Kobayashi et al. ......... 365/226 |

FOREIGN PATENT DOCUMENTS

| JP | 360102574 A | 6/1985 |
| JP | 7-141041 | 6/1995 |
| JP | 411194838 A | 7/1999 |
| JP | 2000-11660 A | 1/2000 |

OTHER PUBLICATIONS

"Decode Type Voltage Trimming Circuit", by Kiyoo Ito, Ultra LSI Memory, Advanced Electronics Series, Baifukan, pp. 266–309.

* cited by examiner

Primary Examiner—Viet Q. Nguyen
(74) Attorney, Agent, or Firm—McDermott, Will & Emery

(57) ABSTRACT

When a tuning mode signal VTUNE is activated, control clock signal TCLK is output, and counter counts up tuning signals TSIG1 to TSIG4. Tuning circuits render conductive the terminals of respective transistors, and reference potential Vref lowers in accordance with the reduction in the resistance value. When reference potential Vref attains equal to the external reference potential Ext.Vref, differential amplifier circuit stops output of the control clock signal TCLK. In accordance with the plurality of the determined tuning signals TSIG1 to TSIG4, fuse elements inside the tuning circuits are programmed.

9 Claims, 30 Drawing Sheets

SEMICONDUCTOR DEVICE INCLUDING INTERNAL POTENTIAL GENERATING CIRCUIT ALLOWING TUNING IN SHORT PERIOD OF TIME AND REDUCTION OF CHIP AREA

This application is a CIP of application Ser. No. 09/489,474 filed on Jan. 21, 2000 now U.S. Pat. No. 6,331,962.

BACKGROUND OF THE INVENTION

1. Field of the Invention

The present invention relates to a semiconductor device and, more specifically, to a semiconductor device mounting an internal power supply generating circuit.

2. Description of the Background Art

Recently, as the semiconductor devices have been developed to operate at ever lower voltages, driving of a transistor in a semiconductor device with a power supply voltage lower than the power supply voltage applied from outside of the semiconductor device has been strongly desired. The requirement of reduced power consumption of the semiconductor device and of higher reliability of the transistor are underlying factors of such trend.

In a dynamic random access memory (DRAM), it is also an important problem to ensure reliability of a dielectric film of a capacitor holding charges in a memory cell.

Upper limit of an internal power supply voltage of a semiconductor device has been made lower generation by generation due to the requirements described above, resulting in ever larger difference from the power supply voltage used in the system. Thus, a voltage down converter is provided, which is a circuit for down converting the power supply voltage used in the system to generate a stable internal power supply voltage. The voltage down converter closes a gap between the power supply voltage used in the system and the internal power supply voltage used in the semiconductor device, so as to ensure the reliability inside the semiconductor device.

FIG. 15 is a circuit diagram representing a configuration of a typical conventional voltage down converter.

Referring to FIG. 15, the voltage down converter includes a reference potential generating circuit 300 for generating a reference potential as a reference for an internal power supply potential generated in a chip, and a voltage converting unit 302 receiving a reference potential Vref generated by reference potential generating circuit 300 and generating an internal power supply potential int.Vcc.

Voltage converting unit 302 includes a differential amplifier circuit 304 comparing levels of reference potential Vref and internal power supply potential int.Vcc, and a P channel MOS transistor 306 receiving an output of differential amplifier circuit 304 at its gate, and connected between an external power supply node receiving an external power supply potential Ext.Vcc and an internal power supply node outputting the internal power supply potential int.Vcc.

Differential amplifier circuit 304 has a negative input node connected to the reference potential Vref and a positive input node receiving the internal power supply potential int.Vcc. Differential amplifier circuit 304 controls switching of P channel MOS transistor 306 to stabilize the internal power supply potential int.Vcc to the same level as the reference potential Vref.

FIG. 16 is a circuit diagram representing a configuration of reference potential generating circuit 300 of FIG. 15.

Referring to FIG. 16, reference potential generating circuit 300 includes a constant current source 312 and a resistance circuit 313 connected in series between a power supply node to which the external power supply potential Ext.Vcc is applied and the ground node. A connection node between constant current source 312 and resistance circuit 313 is an output node of reference potential generating circuit 300, from which reference potential Vref is output.

Reference potential generating circuit 300 further includes a capacitor 324 for stabilizing potential, connected between the output node outputting the reference potential Vref and the ground node.

Resistance circuit 313 includes P channel MOS transistors 314 to 322 connected in series between the output node outputting the reference potential Vref and the ground node. P channel MOS transistors 314 to 322 receive at their gates the ground potential.

Resistance circuit 313 further includes a switch circuit 326 connected in parallel with P channel MOS transistor 314, a switch circuit 328 connected in parallel with P channel MOS transistor 316, a switch circuit 330 connected in parallel with P channel MOS transistor 318, and a switch circuit 332 connected in parallel with P channel MOS transistor 320.

As a constant current applied from constant current source 212 flows against the channel resistances of P channel MOS transistors 314 to 322, reference potential Vref is determined. In order to prevent fluctuation of reference potential Vref due to the variation of channel resistances of P channel MOS transistors, switch circuits 316 to 332 include fuse elements. The configuration allows adjustment of reference potential Vref by changing the state of conduction of each fuse element. By switching the switch circuits between the conduction and non-conduction states in accordance with the setting of the fuses, tuning to $2^4$ different values, that is, 16 values is possible.

Determination of fuse setting will be described in the following.

FIG. 17 is a circuit diagram showing detailed configuration of switch circuit 326.

Referring to FIG. 17, switch circuit 326 includes a pad 390 receiving a tuning signal TSIGn, an inverter 392 receiving and inverting the tuning signal TSIGn, an N channel MOS transistor 396 connected in series between nodes NAn and NBn, a fuse element 398, and a P channel MOS transistor 394 connected in parallel with N channel MOS transistor 396 and receiving tuning signal TSIGn.

An output of inverter 392 is applied to the gate of N channel MOS transistor 396. Node NAn is connected to the source of P channel MOS transistor 314 of FIG. 15, and node NBn is connected to the drain of P channel MOS transistor 314.

In a default state where the fuse is not blown off and the tuning signal TSIGn is at an L (low) level, nodes NAn and NBn of switch circuits 326 are conducted. When the tuning signal TSIGn is set to an H (high) level, conduction is lost between nodes NAn and NBn, and thus a state is established which is equivalent to the state where fuse element 398 is blown off.

Switch circuits 328 and 330 shown in FIG. 16 have similar structures as switch circuit 326, and therefore, description thereof is not repeated.

FIG. 18 is a circuit diagram representing a configuration of switch circuit 332 shown in FIG. 16.

Referring to FIG. 18, switch circuit 332 includes a P channel MOS transistor 402 having its gate connected to the ground node and its source coupled to the external power supply potential Ext.Vcc, an N channel MOS transistor 406 having its gate connected to the ground node and connected between node N31 and the ground node, a fuse element 404 connected between the drain of P channel MOS transistor 402 and node N31, N channel MOS transistors 420 and 422 connected in parallel between node N31 and the ground node, and an inverter 410 having an input node connected to node N31.

A signal BIAS of which level is constant is applied to the gate of N channel MOS transistor 420, and an output of inverter 410 is applied to the gate of N channel MOS transistor 422.

Switch circuit 332 further includes a pad 408 receiving the tuning signal TSIGn, an OR circuit 412 receiving the tuning signal TSIGn and an output of inverter 410, an inverter 414 receiving and inverting an output of OR circuit 412, and a P channel MOS transistor 418 and an N channel MOS transistor 416 connected in parallel between nodes NAn and NBn.

An output of OR circuit 412 is applied to the gate of N channel MOS transistor 416, and an output of inverter 414 is applied to the gate of P channel MOS transistor 418.

In the default state where tuning signal TSIGn is at the L level and fuse element 404 is not blown off, conduction is not established between nodes NAn and NBn in switch circuit 332. Node NAn of switch circuit 332 is connected to the source of P channel MOS transistor 320 of FIG. 15, and node NBn is connected to the drain of P channel MOS transistor 320.

A constant current flows through N channel MOS transistor 420 because of the potential BIAS. When fuse element 404 is blown off, the potential of node N31 attains to the L level, and in response, conduction is established between nodes NAn and NBn. When the tuning signal TSIGn is set to the H level, conduction is established between nodes NAn and NBn, attaining an equivalent state as the state where fuse 404 is blown off.

FIG. 19 is a block diagram illustrating a configuration of a conventional boosted power supply circuit generating a boosted potential provided in a semiconductor device.

Referring to FIG. 19, in the conventional semiconductor device, when the reference potential Vref to be applied to the voltage down converter is to be tuned, the boosted power supply circuit is inactivated. More specifically, a ring oscillator 332 generating fundamental clock of the boosted power supply circuit stops its operation in response to the tuning signal, so that application of a clock signal φ0 to a frequency division counter 336 is stopped, and input of clock signals φ and /φ to a charge pump 344 is stopped. Thus, operation of charge pump 334 is stopped.

Frequency division counter 336 divides frequency of clock signal φ0 output from the ring oscillator to provide a clock signal φ for the charge pump 344. A lower bit of a counter value, however, is generally not used. Such a counter is often not used while an operation related to setting of the fuses is in progress.

As described above, at the time of a test, a control signal is applied to establish a state equivalent to a state where the fuse is blown off, and internal power supply potential at that time is monitored, so that an optimal combination of fuse elements to be blown off can be found. Generally, the fuse element is blown off by a laser beam, using a test apparatus used exclusively therefor.

When such a laser trimming method is adopted, the fuse element is protected by a guard ring or the like so that polysilicon or the like blown off by the laser beam does not affect other circuitry. Therefore, it is impossible in a semiconductor device having a laser trimming type redundancy circuit to attain uniform shrink around the fuse element.

Shrink refers to use of design data of a semiconductor device designed in accordance with the design rule which is dominant presently or in the past with magnification modified to satisfy a corresponding new design rule to address development of new, more miniaturized semiconductor process. Shrink allows production of the semiconductor device with smaller chip area while making use of the design assets of the past.

As the design rule develops, the ratio of the chip area occupied by the fuse elements which cannot be shrunk attains relatively high, which presents a problem to be solved.

Further, the signal input pad provided in the semiconductor device also requires handling different from other regions at the time of shrinkage. Generally, in order to tune the reference potential Vref, signal input pads for receiving tuning signals TSIG1 to TSIG4 as inputs and a monitor pad for monitoring the reference potential Vref or the internal power supply potential int.Vcc are necessary, which means that the number of pads is disadvantageously large.

SUMMARY OF THE INVENTION

An object of the present invention is to provide a semiconductor device which can reduce the number of pads necessary for tuning the reference potential Vref, the chip area and the time necessary for tuning.

Briefly stated, the present invention provides a semiconductor device including a tuning signal generating circuit and a reference potential generating circuit. The tuning signal generating circuit outputs, in accordance with time change of a control signal of a single bit, a tuning signal having a plurality of signal bits. The reference potential generating circuit receives a first power supply potential and a second power supply potential lower than the first power supply potential, and outputs a reference potential in accordance with the tuning signal.

Therefore, an advantage of the present invention is that the number of pads necessary for tuning the reference potential Vref can be reduced and hence, the chip area of the semiconductor device can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a schematic diagram representing a configuration of a refresh address counter 25a.

FIG. 14 is a circuit diagram representing a configuration of a voltage down converter 38a.

FIG. 28 represents various internal potentials when external power supply potential Ext.Vcc is turned on.

DESCRIPTION OF THE PREFERRED EMBODIMENTS

Figure 1:
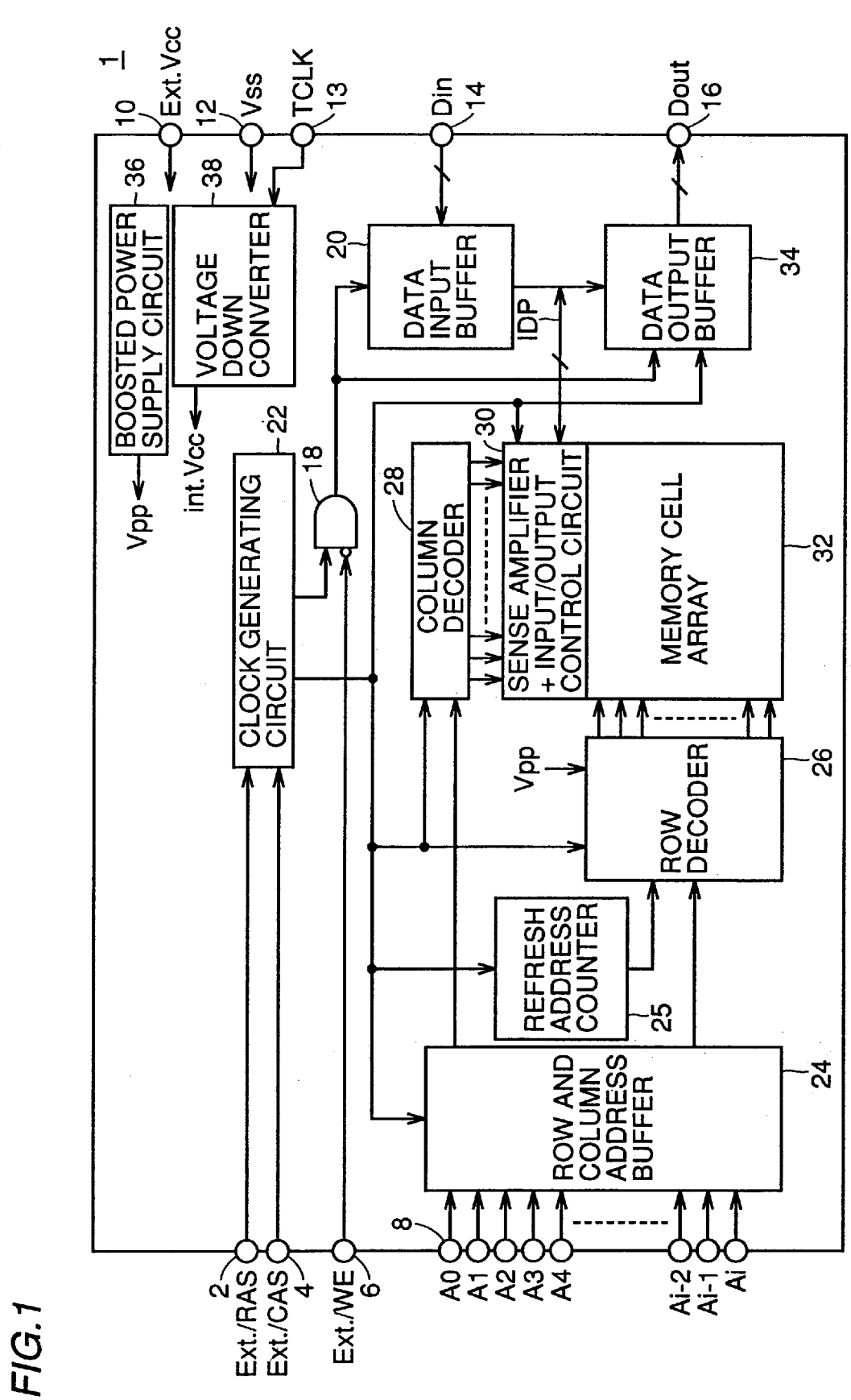
FIG. 1 is a schematic block diagram representing a configuration of a semiconductor device 1 in accordance with a first embodiment of the present invention.

In the following, embodiments of the present invention will be described in detail with reference to the drawings. Throughout the figures, the same reference character denote the same or corresponding portions.

First Embodiment

FIG. 1 is a schematic block diagram representing a semiconductor device 1 in accordance with a first embodiment of the present invention.

Referring to FIG. 1, semiconductor device 1 includes control signal input terminals 2 to 6 receiving control signals ext./RAS, ext./CAS and ext./WE, respectively, an address input terminal group 8, an input terminal group 14 receiving as an input data signal Din, an output terminal group 16 outputting data signal Dout, a ground terminal 12 receiving a ground potential Vss, a power supply terminal 10 receiving a power supply potential Ext.Vcc, and an input terminal 13 receiving as an input a test control clock signal TCLK.

Semiconductor device 1 further includes a clock generating circuit 22, a row and column address buffer 24, a row decoder 26, a column decoder 28, a sense amplifier+input/output control circuit 30, a memory cell array 32, a gate circuit 18, a data input buffer 20 and a data output buffer 34.

Clock generating circuit 22 generates a control clock corresponding to a prescribed operation mode in accordance with an external row address strobe signal ext./RAS and an external column address strobe signal ext./CAS externally applied through control signal input terminals 2 and 4, and controls overall operation of the semiconductor device.

Row and column address buffer 24 applies an address signal generated from externally applied address signals A0 to Ai (i is a natural number) to row decoder 26 and column decoder 28.

A memory cell array 32 designated by row decoder 26 and column decoder 28 communicates data to and from the outside through sense amplifier+input/output control circuit 30 and data input buffer 20 or data output buffer 34, through input terminal Din or output terminal Dout.

Semiconductor device 1 further includes a boosted power supply circuit 36 boosting the external power supply potential Ext.Vcc to generate an internal boosted potential Vpp, and a voltage down converter 38 receiving external power supply potential Ext.Vcc, and down converting the received potential to a voltage in accordance with the setting of control clock signal TCLK to generate an internal power supply potential int.Vcc. The boosted power supply potential Vpp will be a driving potential of a word line driven by row decoder 26. Internal power supply potential int.Vcc is applied to internal circuitry including memory cell array 32.

Semiconductor device 1 further includes a refresh address counter 25 generating and applying to row decoder 26 a refresh address in a prescribed period in a refresh mode, under control by clock generating circuit 22.

Semiconductor device 1 shown in FIG. 1 is a representative example, and the present invention is also applicable to a synchronous semiconductor memory device (SDRAM), for example. Further, the present invention is also applicable to various semiconductor devices provided that a voltage down converter is included.

Figure 2:
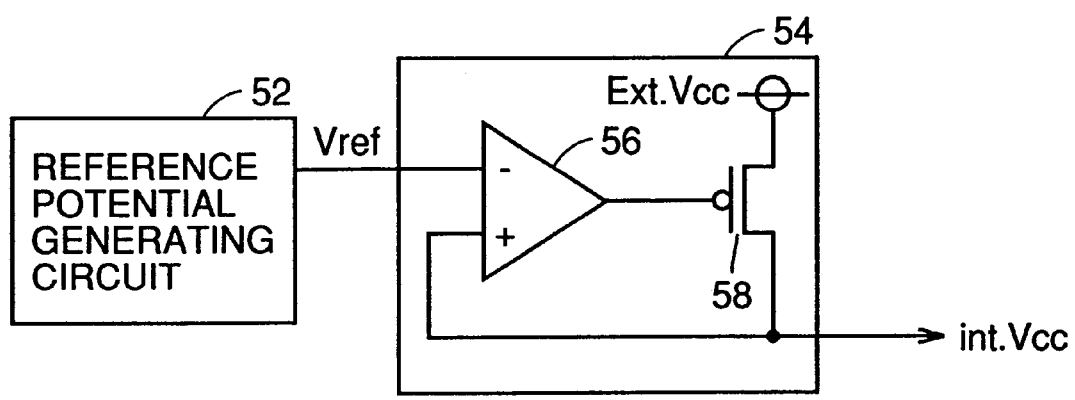
FIG. 2 is a circuit diagram representing a configuration of the voltage down converter 38 shown in FIG. 1.

FIG. 2 is a circuit diagram representing a configuration of voltage down converter 38 shown in FIG. 1.

Referring to FIG. 2, voltage down converter 38 includes a reference potential generating circuit 52 generating a reference potential Vref as a reference for internal power supply potential int.Vcc, and a voltage converting unit 54 receiving reference potential Vref and outputting internal power supply potential int.Vcc.

Voltage converting unit 54 includes a differential amplifier 56 receiving and comparing reference potential Vref and internal power supply potential int.Vcc, and a P channel MOS transistor 58 receiving at its gate an output of differential amplifier circuit 56 and connected between a power supply node receiving external power supply potential Ext.Vcc and a power supply node receiving internal power supply potential int.Vcc.

Figure 3:
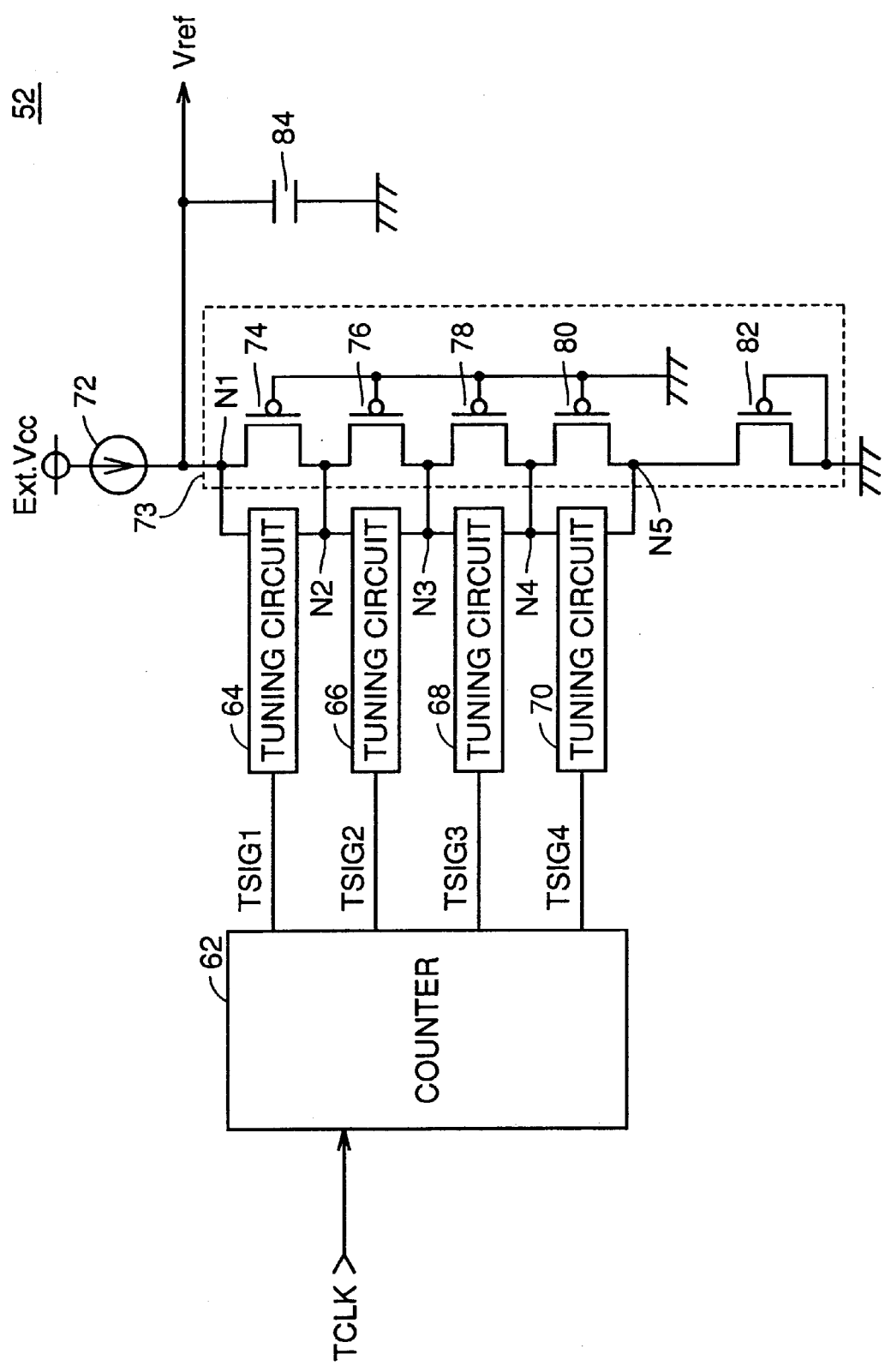
FIG. 3 is a circuit diagram representing a configuration of a reference potential generating circuit 52 shown in FIG. 2.

FIG. 3 is a circuit diagram representing a configuration of reference potential generating circuit 52 shown in FIG. 2.

Referring to FIG. 3, reference potential generating circuit 52 includes a counter 62 outputting tuning signals TSIG1 to TSIG4 in accordance with a control clock signal TCLK, a constant current source 72 connected between a power supply node receiving the external power supply potential Ext.Vcc and a node N1, a resistance circuit 73 connected between node N1 and the ground node, and a capacitor 84 for stabilizing potential connected between node N1 and the ground node. Reference potential Vref is output from node N1.

Reference potential generating circuit 52 further includes a tuning circuit 64 establishing conduction between nodes N1 and N2 at the time of tuning in response to tuning signal TSIG1, a tuning circuit 56 connecting nodes N2 and N3 at the time of tuning in response to tuning signal TSIG2, a tuning circuit 68 connecting nodes N3 and N4 at the time of tuning in response to tuning signal TSIG3, and a tuning circuit 70 connecting nodes N4 and N5 at the time of tuning in response to tuning signal TSIG4.

Resistance circuit 73 includes a P channel MOS transistor 74 connected between nodes N1 and N2 and having its gate connected to the ground node, a P channel MOS transistor 76 connected between nodes N2 and N3 and having its gate connected to the ground node, a P channel MOS transistor 78 connected between nodes N3 and N4 and having its gate connected to the ground node, a P channel MOS transistor 80 connected between nodes N4 and N5 and having its gate connected to the ground node, and a P channel MOS transistor 82 having its source connected to node N5 and drain and gate connected to the ground node.

Figure 4:
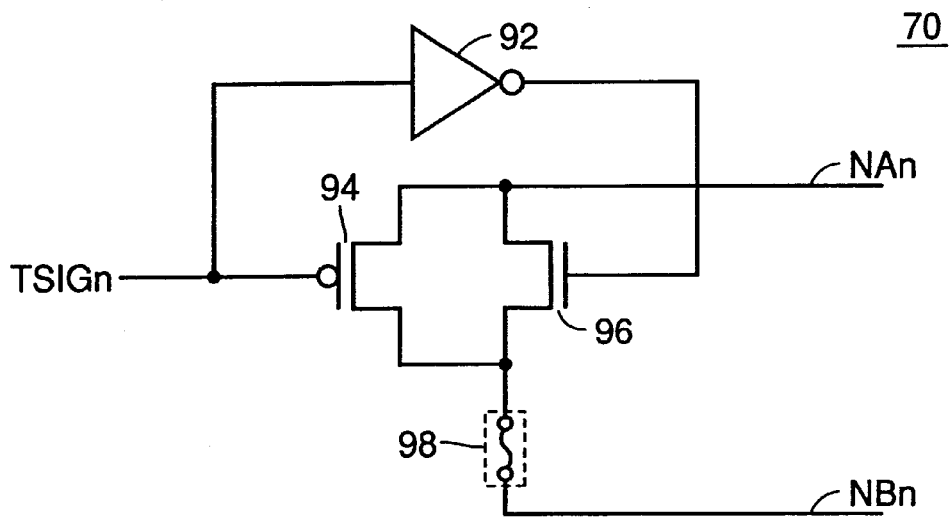
FIG. 4 is a circuit diagram representing a configuration of a tuning circuit 70 shown in FIG. 3.

FIG. 4 is a circuit diagram representing tuning circuit 70 shown in FIG. 3.

Referring to FIG. 4, tuning circuit 70 includes an inverter 92 receiving and inverting tuning signal TSIGn, an N channel MOS transistor 96 and a fuse element 98 connected in series between nodes NAn and NBn, and a P channel MOS transistor 94 connected in parallel with N channel MOS transistor 96 and having its gate connected to tuning signal TSIGn. To the gate of N channel MOS transistor 96, an output of inverter 92 is applied.

Tuning signal TSIGn corresponds to tuning signal TSIG4 of FIG. 3. Node NAn corresponds to node N4 of FIG. 3, and node NBn corresponds to node N5 of FIG. 3.

In a state where the fuse is not yet blown off and the tuning signal is at the L level, nodes NAn and NBn are conducted in tuning circuit 70. Namely, this circuit is rendered conductive in the default state.

Figure 5:
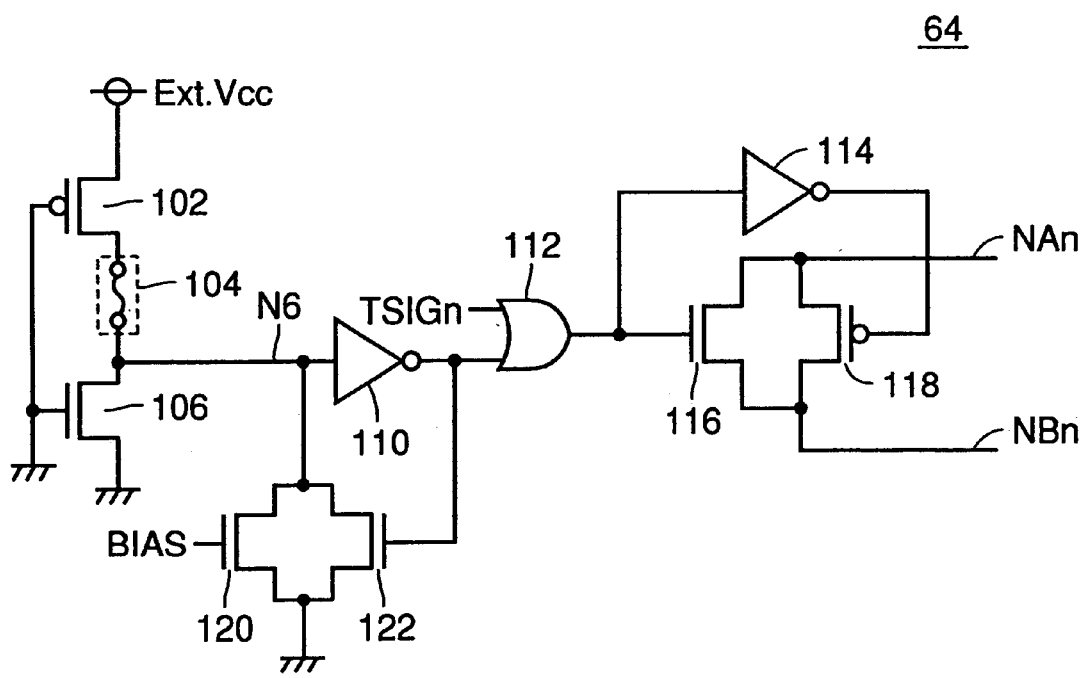
FIG. 5 is a circuit diagram representing a configuration of a tuning circuit 64 of FIG. 3.

FIG. 5 is a circuit diagram representing a configuration of tuning circuit 64 of FIG. 4.

Referring to FIG. 5, tuning circuit 64 includes a P channel MOS transistor 102 having its gate connected to the ground node and its source coupled to external power supply potential Ext.Vcc, a fuse element 104 connected between the drain of P channel MOS transistor 102 and a node N6, an N channel MOS transistor 106 having its gate and source connected to the ground node and its drain connected to node N6, N channel MOS transistors 120 and 122 connected in parallel between node N6 and the ground node, and an inverter 110 having an input node connected to node N6. The signal BIAS is applied to the gate of N channel MOS transistor 120, and an output of inverter 110 is applied to the gate of N channel MOS transistor 122.

Tuning circuit 64 further includes an OR circuit 122 receiving tuning signal TSIGn and an output of inverter 110, an inverter 114 receiving and inverting an output of OR circuit 112, and an N channel MOS transistor 116 and a P channel MOS transistor 118 connected in parallel between nodes NAn and NBn. An output of OR circuit 112 is applied to the gate of N channel MOS transistor 116, and an output of inverter 114 is applied to the gate of P channel MOS transistor 118.

Tuning signal TSIGn of FIG. 5 corresponds to tuning signal TSIG1 of FIG. 3, and nodes NAn and NBn correspond to nodes N1 and N2 of FIG. 3, respectively.

The tuning circuits 66 and 68 shown in FIG. 3 have similar structure as tuning circuit 64, and therefore description thereof is not repeated. It is noted, however, that in tuning circuit 66, tuning signal TSIGn of FIG. 5 corresponds to tuning signal TSIG2, node NAn corresponds to node N2 and node NBn corresponds to node N3.

In tuning circuit 68 of FIG. 3, tuning signal TSIGn and nodes NAn and NBn of FIG. 5 correspond to tuning signal TSIG3 and nodes N3 and N4, respectively.

The tuning circuits 64 to 68 are circuits in which conduction between nodes NAn and NBn is lost when the tuning signals TSIG1 to TSIG3 are at the L level, that is, in the default state.

As tuning circuits 64, 66 and 68 are implemented as circuits which are non-conductive in the default state and tuning circuit 70 is implemented as a circuit which is conductive in the default state, it becomes possible to set channel resistance value before laser trimming at a central value of the tuning range. This is because the channel resistance values of P channel MOS transistors 74, 76, 78 and 80 are set to satisfy the ratio of (1:2:4:8). By the tuning operation in which tuning signals TSIG1 to TSIG4 are changed, sum of channel resistance values can be increased/decreased, so that the potential of reference potential Vref can be set to a desired value.

Again referring to FIG. 3, the process of tuning the reference potential Vref will be described.

First, control clock signal TCLK is input from the outside of the device to counter 62. Control clock signal TCLK is a pulse signal, and receiving control clock signal TCLK, counter 62 operates.

Every time the pulse of control clock signal TCLK is input, combination of tuning signals TSIG1 to TSIG4 changes to any of sixteen different combinations. More specifically, when the signals TSIG1 to TSIG4 are all at the L level, tuning circuits 64, 66 and 68 are rendered nonconductive, and tuning circuit 70 is rendered conductive. When the tuning signals TSIG1 to SIG4 are all at the H level, tuning circuits 64, 66 and 68 are rendered conductive and tuning circuit 70 is rendered non-conductive.

In this manner, as counter output value counts from 0000 to 1111, it is possible to realize sixteen different combinations of tuning signals TSIG1 to TSIG4, and therefore it is possible to adjust resistance value of resistance circuit 73 to sixteen different values.

Determination of the optimal tuning condition is made by monitoring either the reference potential Vref or the internal power supply potential int.Vcc which is an output of the voltage down converter.

In the conventional circuit structure, four pads are provided for controlling the tuning signals TSIG1 to TSIG4 in accordance with input signals from outside of the chip.

In the semiconductor device 1 in accordance with the first embodiment, tuning signals TSIG1 to TSIG4 can be changed by the input of the control clock signal TCLK through an input pad for inputting the control clock signal TCLK, and therefore it is possible to reduce the number of pads and hence to reduce the chip area of the semiconductor device.

Second Embodiment

In the second embodiment, a voltage down converter 130 is provided in place of the voltage down converter 38 shown in FIG. 2.

Figure 6:
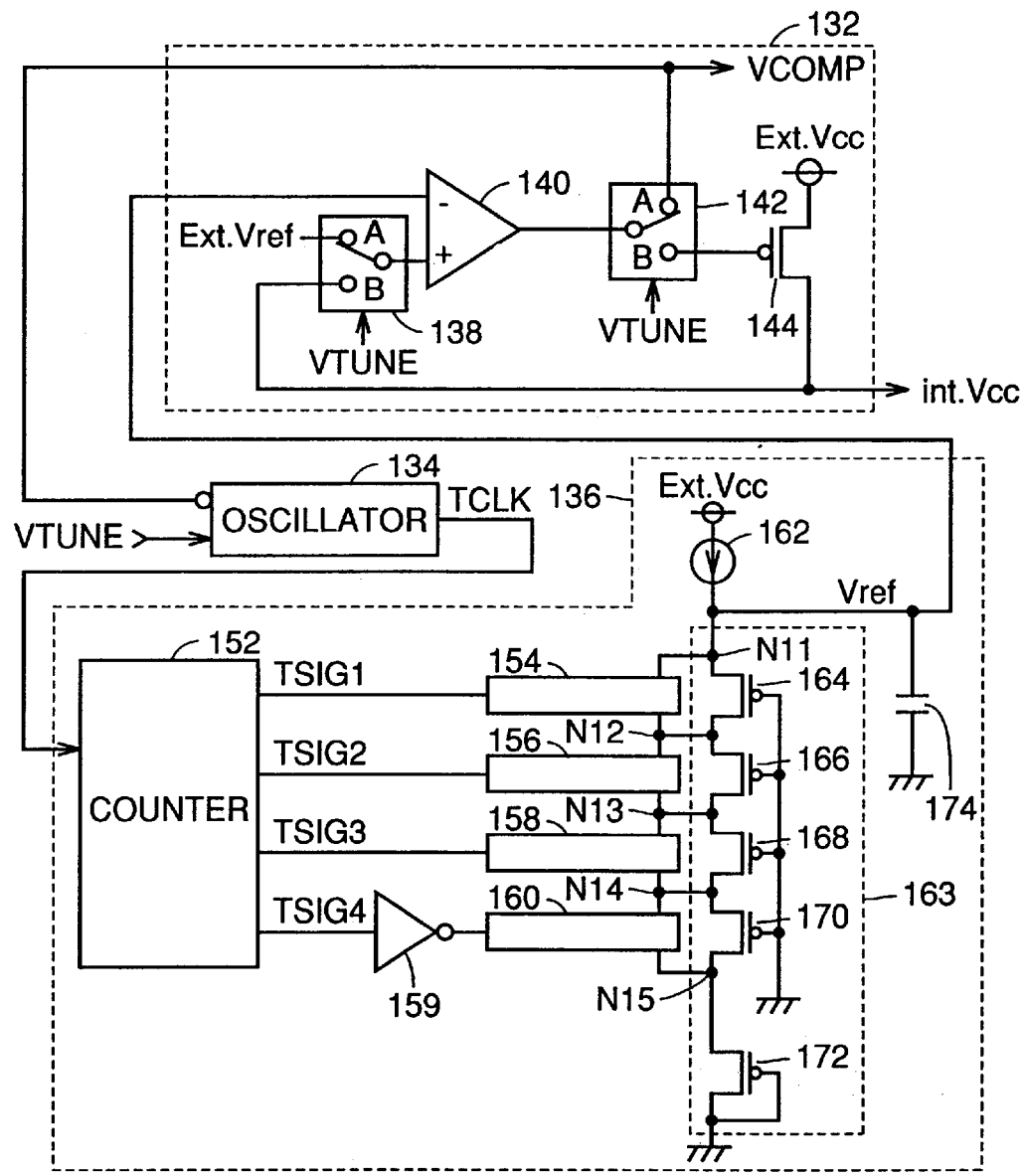
FIG. 6 is a circuit diagram representing a configuration of a voltage down converter 130.

FIG. 6 is a circuit diagram representing the configuration of voltage down converter 130.

Referring to FIG. 6, voltage down converter 130 includes an oscillator 134 outputting the control clock signal TCLK in accordance with a tuning mode signal VTUNE and a comparison signal VCOMP, a reference potential generating circuit 136 receiving the control clock signal TCLK and outputting the reference potential Vref, and a voltage converting unit 132 receiving the reference potential Vref and generating internal power supply potential int.Vcc and the comparison signal VCOMP. The tuning mode signal VTUNE is set to the H level when the reference potential Vref is to be tuned.

Reference potential generating circuit 136 includes a counter 152 outputting tuning signals TSIG1 to TSIG4 in accordance with the control clock signal TCLK, an inverter 159 receiving and inverting the signal TSIG4, a constant current source 162 connected between a power supply node to which the external power supply potential Ext.Vcc is applied and a node N11, a resistance circuit 163 connected between node N11 and the ground node, and a capacitor 174 for stabilizing potential connected between N11 and the ground node. Reference potential Vref is output from node N11.

Reference potential generating circuit 136 further includes a tuning circuit 154 establishing conduction between nodes N11 and N12 at the time of tuning in response to tuning signal TSIG1, a tuning circuit 156 connecting nodes N12 and N13 at the time of tuning in response to tuning signal TSIG2, a tuning circuit 158 connecting nodes N13 and N14 at the time of tuning in response to tuning signal TSIG3, and a tuning circuit 160 connecting nodes N14 and N15 at the time of tuning in response to an output of inverter 159.

Resistance circuit 163 includes a P channel MOS transistor 164 connected between nodes N11 and N12 and having its gate connected to the ground node, a P channel MOS transistor 166 connected between nodes N12 and N13 and having its gate connected to the ground node, a P channel MOS transistor 168 connected between nodes N13 and N14 and having its gate connected to the ground node, a P channel MOS transistor 170 connected between nodes N14 and N15 and having its gate connected to the ground node, and a P channel MOS transistor 172 having its source connected to node N15 and its drain and gate connected to the ground node.

Voltage converting unit 132 includes a selection switch 138 outputting either the reference potential Ext.Vref applied in the tuning mode from the outside or the internal power supply potential int.Vcc in accordance with the tuning mode signal VTUNE, a differential amplifier circuit 140 receiving at a negative input node the reference potential Vref and at the positive input node an output of selection switch circuit 138, a selection switch circuit 142 providing the output of differential amplifier circuit 140 either to an output node A or an output node B in accordance with a tuning mode signal VTUNE, and a P channel MOS transistor 144 having its gate connected to the output node B of selection switch circuit 142 and connected between the power supply node to which the external power supply potential Ext.Vcc is applied and the power supply node to which the internal power supply potential int.Vcc is applied.

In selection switches 138 and 142, in the normal operation, the tuning mode signal VTUNE is set to L level and the B side is used. At this time, voltage converting unit 132 outputs the internal power supply potential int.Vcc in accordance with the reference potential Vref. When tuning is to be performed, tuning mode signal VTUNE is set to the H level, and the switch is switched to the A side in selection switch circuit 138 and 142. Differential amplifier 140 is used as a comparing circuit comparing the tuning level.

A circuit such as shown in FIG. 5 which is rendered non-conductive in the default state is used as tuning circuits 154, 156 and 158. A circuit such as shown in FIG. 4 which is rendered conductive in the default state is used as tuning circuit 160.

The tuning signal TSIG4 output from counter 152 is inverted by inverter 159, and inverted signal/TSIG4 is applied to tuning circuit 160. Accordingly, when tuning signals TSIG1 to TSIG4 are all at the L level, tuning circuits 154, 156, 158 and 160 are rendered non-conductive, and resistance value at the opposing ends of resistance circuit 163 is maximized. As a constant current is caused to flow through resistance circuit 163 by constant current source 162, reference potential Vref assumes the maximum value at this time. When tuning signals TSIG1 to TSIG4 are all at the H level, tuning circuits 154, 156, 158 and 160 are rendered conductive, so that resistance value at the opposing ends of resistance circuit 163 is minimized and reference potential Vref assumes the minimum value.

When the tuning mode signal VTUNE is at the H level, the A side of the switch is used in selection switch circuits 138 and 142. At this time, the external reference potential Ext.Vref applied from the outside is set to that potential level which is to be set as the reference potential Vref. Differential amplifier 140 compares difference of input two potentials, amplifies the difference and provides the result as the comparison signal VCOMP. When the reference potential Vref is higher than the external reference potential Ext.Vref, the comparison signal VCOMP attains to the L level, and when the reference potential Vref becomes lower than the external reference potential Ext.Vref, the comparison signal VCOMP attains to the H level. When the tuning signals TSIG1 to TSIG4 at this time are output externally, it can be recognized how the fuses contained in tuning circuits 154 to 160 are to be set.

The values of tuning signals TSIG1 to TSIG4 at this time are output utilizing a pad through which data output signal Dout is output.

Figure 7:
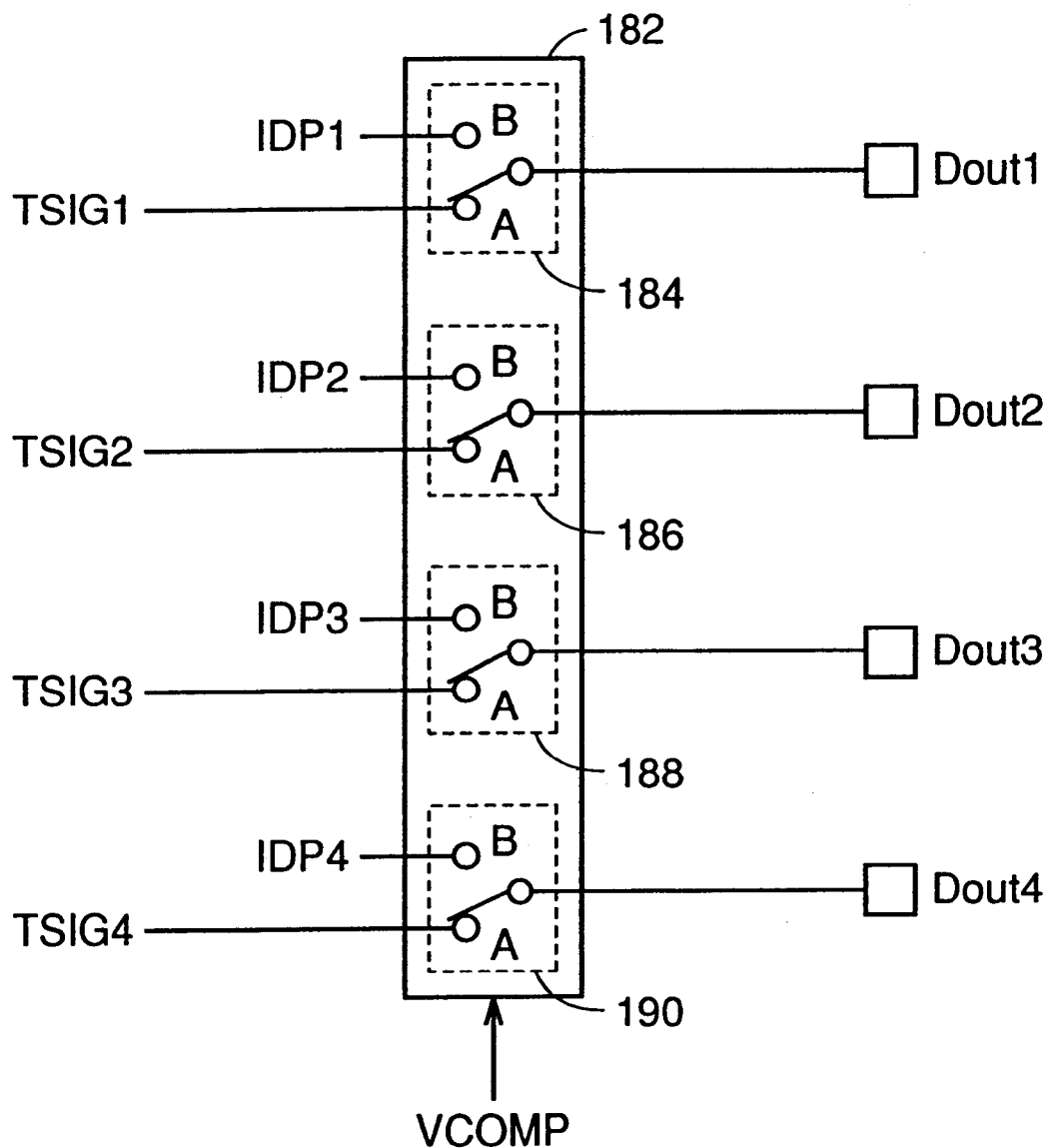
FIG. 7 is an illustration of a switch circuit 18 for externally outputting tuning signals TSIG1 to TSIG4.

FIG. 7 is an illustration representing switching circuit 18 for externally outputting tuning signals TSIG1 to TSIG4.

Referring to FIG. 7, switching circuit 182 includes a selection switch 184 outputting either the tuning signal TSIG1 or the internal data signal IDP1 as output signal Dout1, a selection switch circuit 186 outputting either the tuning signal TSIG2 or the internal data signal IDP2 as output signal Dout2, a selection switch circuit 188 outputting either the tuning signal TSIG3 or the internal data signal IDP3 as output signal Dout3, and a selection switch circuit 190 outputting either the tuning signal TSIG4 or the internal data signal IDP4 as output signal Dout4.

Tuning signals TSIG1 to TSIG4 are signals output from counter 152 of FIG. 6, and IDP1 to IDP4 are internal data signals input to data output buffer 34 in FIG. 1. Switching circuit 182 selectively outputs either one of the two signals input to output buffer 34 of FIG. 1.

In a normal operation, that is, when comparison signal VCOMP is at L level, B side of selection switch circuits 184 to 190 is used. Thus internal data signals IDP1 to IDP4 are output as data output signals Dout1 to Dout4. When the comparison signal VCOMP attains to the H level, selection switch circuits 184 to 190 are switched to the A side. At that time, tuning signals TSIG1 to TSIG4 are output as data output signals Dout1 to Dout4.

Figure 8:
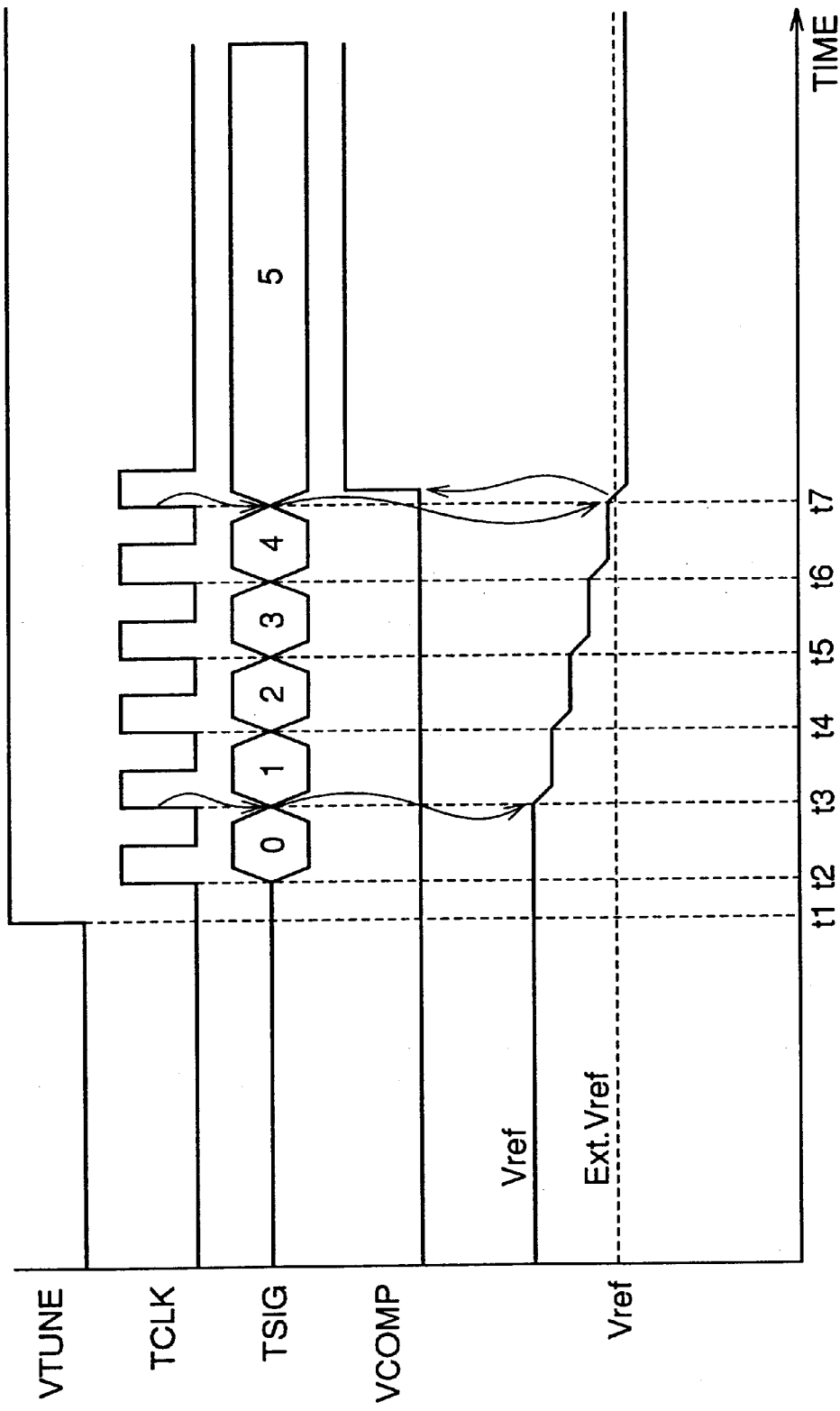
FIG. 8 is a diagram of waveforms related to the operation of voltage down converter 130 in accordance with a second embodiment.

FIG. 8 is a diagram of waveforms representing the operation of voltage down converter 130 in accordance with the second embodiment.

Referring to FIGS. 6 and 8, at time t1, tuning mode signal VTUNE is set from L to H level. In response, oscillator 134 starts output of the control clock signal TCLK. After time t2, counter 152 starts counting in synchronization with a rising edge of control clock signal TCLK. The signal TSIG of FIG. 8 represents a 4 bit signal including tuning signals TSIG1 to TSIG4, where tuning signal TSIG1 is the least significant bit and the tuning signal TSIG4 is the most significant bit. At time points t3, t4, t5, t6 and t7, the value of tuning signal TSIG is counted from 0 to 5, in response to the rise of the control clock signal TCLK. As the resistance value of resistance circuit 163 decreases in accordance with the count value, reference potential Vref gradually lowers.

At time t7, when the reference potential Vref generated inside becomes lower than the externally applied external reference potential Ext.Vref, the output of differential amplifier circuit 140 attains to the H level and the comparison signal VCOMP attains to the H level. In response, oscillation of oscillator 134 stops, and counter circuit 152 stops counting up. More specifically, the tuning signals TSIG1 to TSIG4 at the time point when comparison signal VCOMP attains to H level are maintained.

By externally outputting the signals by using such a circuit as shown in FIG. 7, it is possible to recognize how the fuses contained in tuning circuits 154 to 160 are to be set. When the fuses are blown off using a laser trimming apparatus in accordance with the output data, a desired reference potential can be obtained even in the normal operation.

When the tuning signal is output by switching after the end of tuning, using the circuit of FIG. 7, the data output pin can be set to the normal operation state while the tuning condition is determined. It is desired that tuning is performed under the same condition as the actual operation. When the data output pin is set in the normal operation state, undesirable influence of fluctuation in power consumed by the voltage down converter or the like on tuning can be prevented.

In the conventional semiconductor device, tuning signals TSIG1 to TSIG4 are applied from the outside of the semiconductor device and the tuning level is compared by a tester. Therefore, a total of five pads, that is, input pads for tuning signals TSIG1 to TSIG4 and a pad for monitoring the reference potential Vref are necessary. Further, the tuning level was measured and determined by a tester connected to the semiconductor device. As the tester monitors the reference potential Vref while varying the tuning signals TSIG1 to TSIG4, determination has been a time consuming operation.

By contrast, in the semiconductor device in accordance with the second embodiment, tuning is possible using only one pad for reference potential Ext.Vref applied from the outside as a reference, and therefore it is possible to reduce the number of pads provided for the semiconductor device. Further, it is possible to compare the external reference potential Ext.Vref and the reference potential Vref, determine tuning condition when the reference potentials match, and thereafter output the result of determination to the data output pin. The tuning signal may be output not to the data output pin but to any other control pin on the semiconductor device. In the tuning mode, tuning condition is determined by operating a counter in the semiconductor device, and therefore a separate tester or the like for comparing voltage is unnecessary. Therefore, the time for testing required for tuning can be reduced.

Third Embodiment

The periphery of a fuse element which can be blown off by a laser beam cannot be uniformly shrunk. As the design rule develops, the ratio of the fuse element occupying the chip area attains relatively high, which is a problem to be solved.

U.S. Pat. No. 5,631,862 proposes, as means to solve this problem, an insulation film braking type electric fuse. Such an electric fuse is referred to as an antifuse. When such a fuse is used, it is unnecessary to use an apparatus exclusively provided for blowing off, and the fuse can be blown off during wafer test. Therefore, time and cost for testing can be reduced.

In the semiconductor device in accordance with the third embodiment, the electric fuse is used in the structure of tuning circuits 154 to 160 of the voltage down converter 130 of the semiconductor device shown in the second embodiment. An antifuse which breaks an insulating layer between electrodes by applying a high voltage is used as the electric fuse.

In the third embodiment, a tuning circuit 200 is used in place of tuning circuits 154, 156 and 158 shown in FIG. 6. Further, a tuning circuit 240 is used in place of tuning circuit 160.

Figure 9:
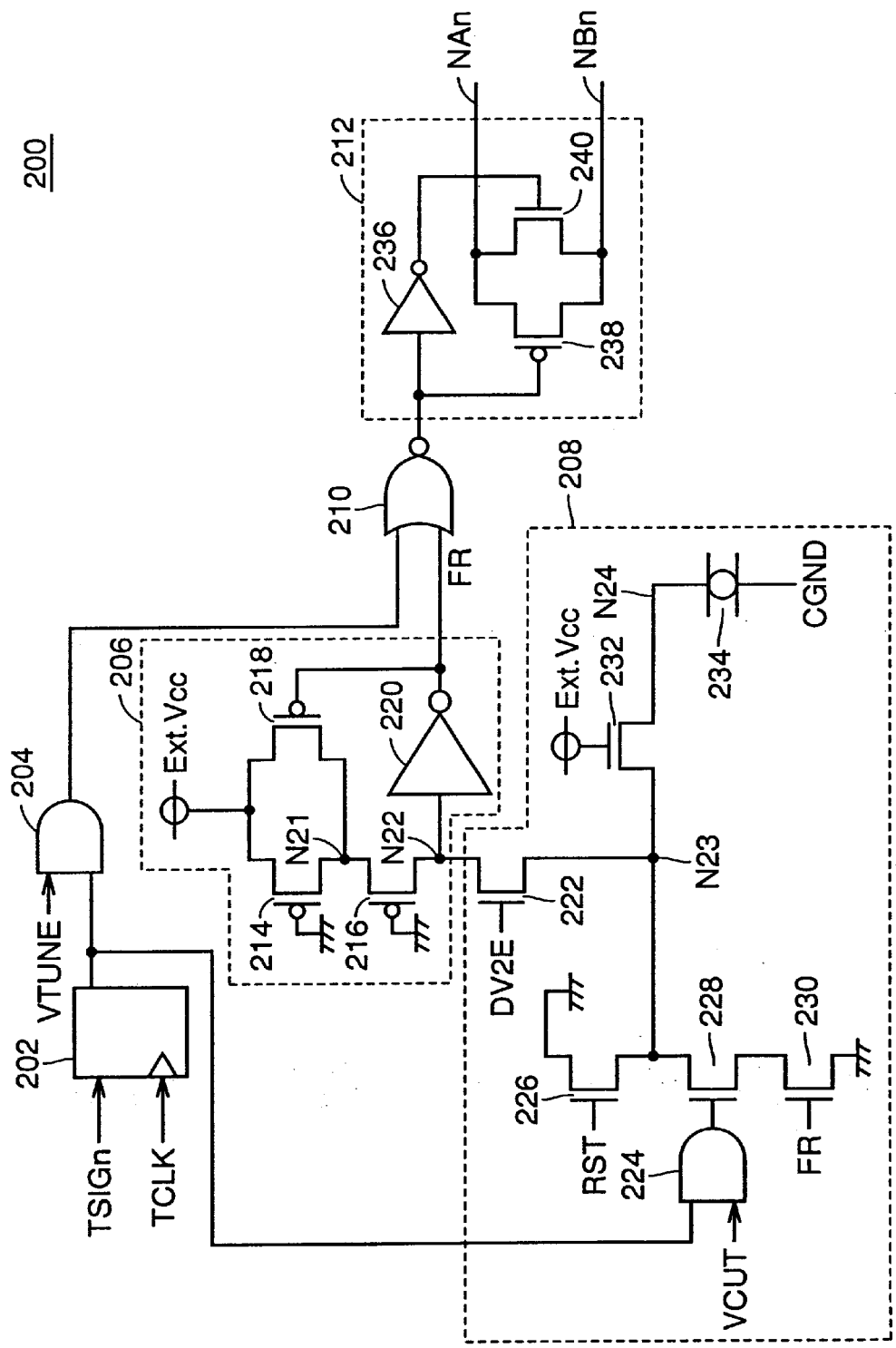
FIG. 9 is a circuit diagram representing a configuration of a tuning circuit 200.

FIG. 9 is a circuit diagram representing a combination of tuning circuit 200.

Referring to FIG. 9, tuning circuit 200 includes a latch 202 taking and holding a tuning signal TSIGn at an edge of control clock signal TCLK, an AND circuit 204 receiving tuning mode signal VTUNE and an output of latch 202, a latch circuit 206 outputting a signal FR which corresponds to information set in an antifuse, a latch control unit 208 controlling latch circuit 206, an NOR circuit 210 receiving an output of AND circuit 204 and the signal FR, and a switch circuit 212 receiving an output of NOR circuit 210 and controlling connection between nodes NAn and NBn.

Latch control unit 208 includes an N channel MOS transistor 226 connected between a node N23 and the ground node and receiving at its gate a reset signal RST, N channel MOS transistors 228 and 230 connected in series between node N23 and the ground node, an N channel MOS transistor 232 connected between nodes N23 and N24 and having its gate coupled to external power supply potential Ext.Vcc, an antifuse 234 connected between nodes N24 and CGND, and an N channel MOS transistor 222 connected between nodes N22 and N23 and receiving at its gate the signal DV2E.

Latch control unit 208 further includes an AND circuit 224 receiving an output of latch circuit 202 and a signal VCUT. An output of AND circuit 224 is applied to the gate of N channel MOS transistor 228. The signal FR, which is an output of latch circuit 206, is applied to the gate of N channel MOS transistor 230.

Latch circuit 206 includes P channel MOS transistors 214 and 218 having their sources coupled together to external power supply potential Ext.Vcc and their drains connected together to node N21, a P channel MOS transistor 216 connected between nodes N21 and N22 and having its gate connected to the ground node, and an inverter 220 having an input node connected to node N22. P channel MOS transistor 214 has its gate connected to the ground node. Inverter 220 outputs the signal FR. The signal FR is applied to the gate of P channel MOS transistor 218.

Switch circuit 212 includes an inverter 236 receiving and inverting an output of NOR circuit 210, and a P channel MOS transistor 238 and an N channel MOS transistor 240 connected in parallel between nodes NAn and NBn. An output of NOR circuit 210 is applied to the gate of P channel MOS transistor 238. An output of inverter 236 is applied to the gate of N channel MOS transistor 240.

In tuning circuit 200, when antifuse 234 is not blown off in the normal operation, conduction is not established between nodes NAn and NBn, as the default state. When antifuse 234 is blown off and conduction between nodes N24 and CGND is established in the normal operation, switch circuit 214 establishes conduction between nodes NAn and NBn.

Figure 10:
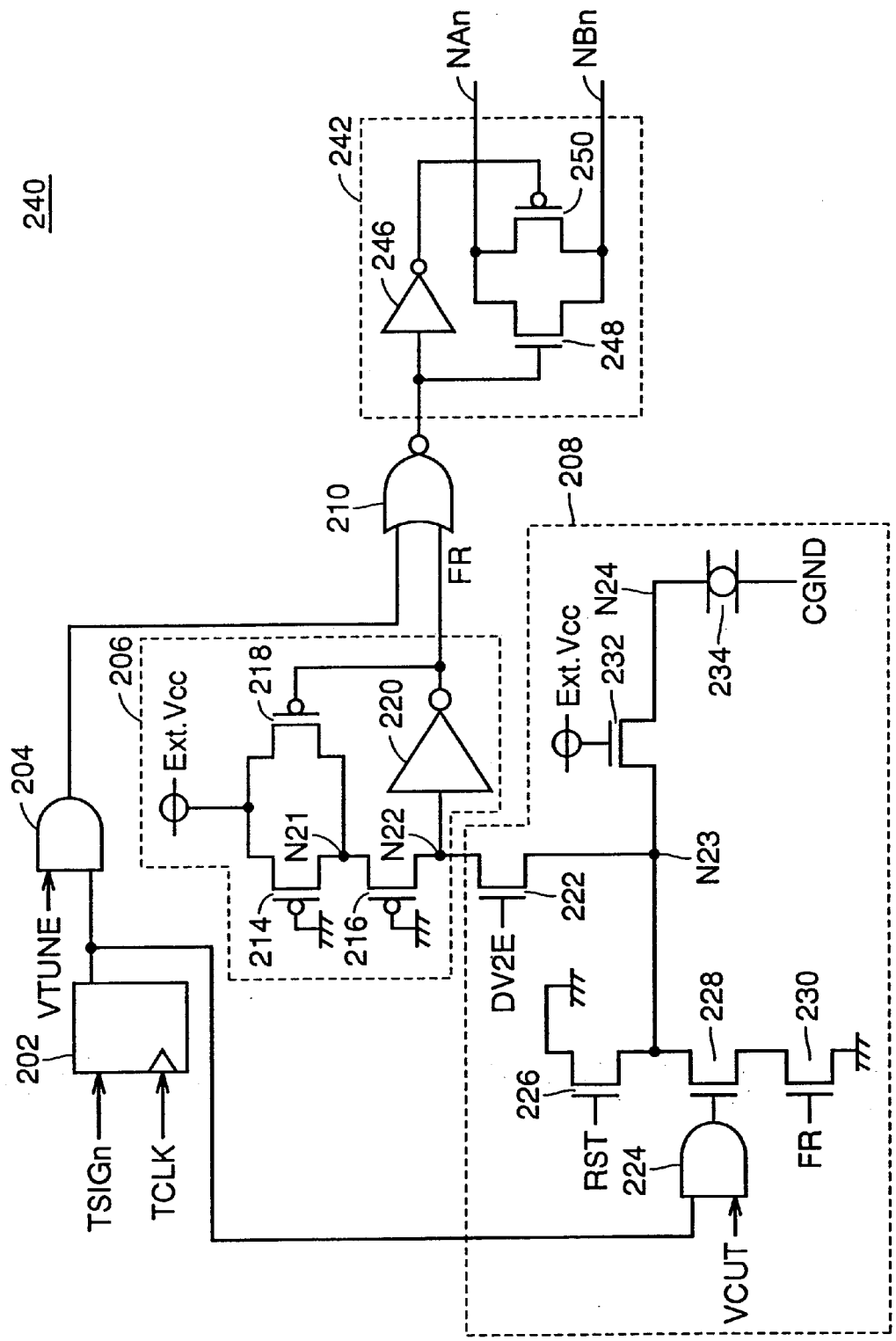
FIG. 10 is a circuit diagram representing a configuration of a tuning circuit 240.

FIG. 10 is a circuit diagram representing a configuration of tuning circuit 240. Referring to FIG. 10, tuning circuit 240 includes the configuration of tuning circuit 200 shown in FIG. 9, with switch circuit 242 used in place of switch circuit 212.

Switch circuit 242 includes an inverter 246 receiving and inverting an output of NOR circuit 210, an N channel MOS transistor 248 receiving at its gate an output of NOR circuit 210 and connected between nodes NAn and NBn, and a P channel MOS transistor 250 receiving at its gate an output of inverter 246 and connected between nodes NAn and NBn.

Except this point, the configuration is the same as that of tuning circuit 200 shown in FIG. 9. Therefore, description thereof is not repeated.

In tuning circuit 240, nodes NAn and NBn are conducted in the default state where antifuse 234 is not blown off.

Figure 14:
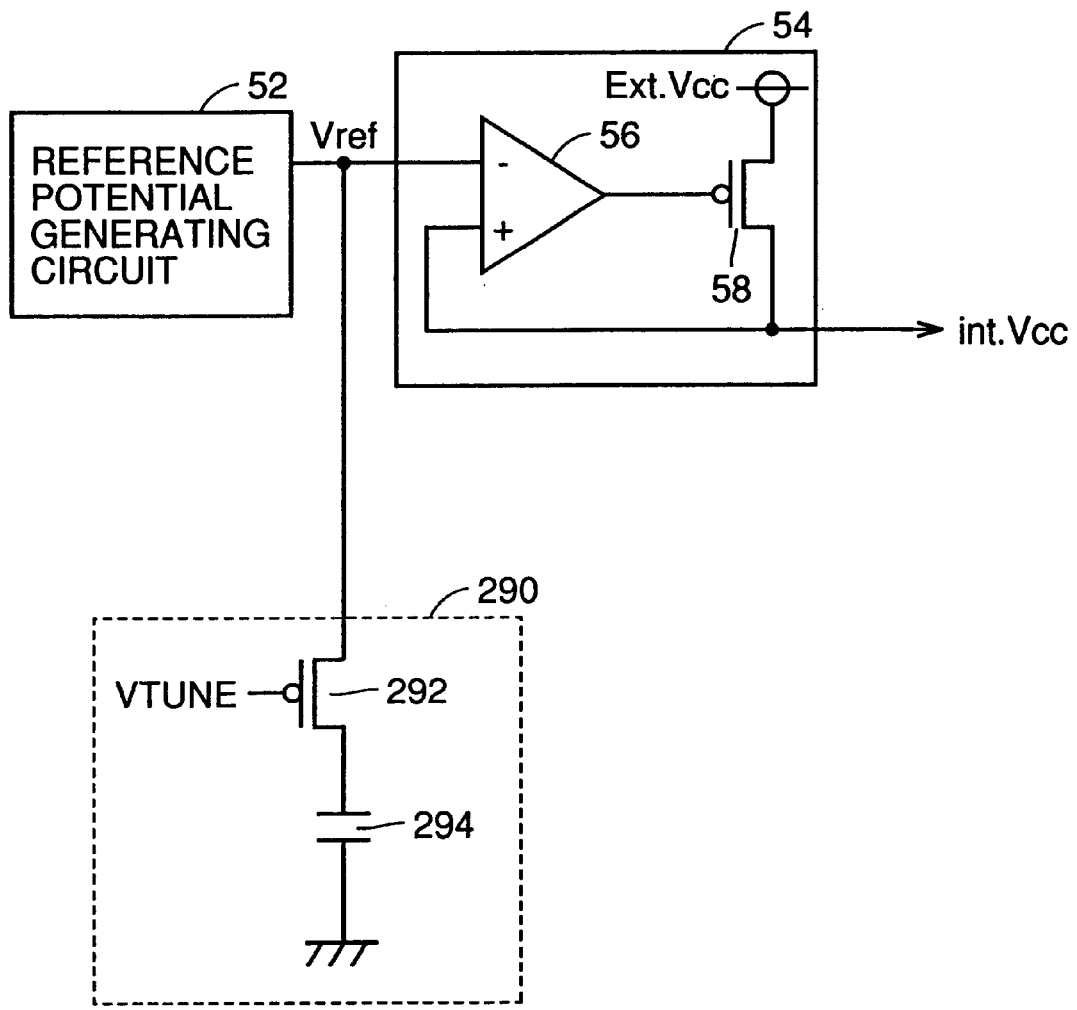
Figure 15:
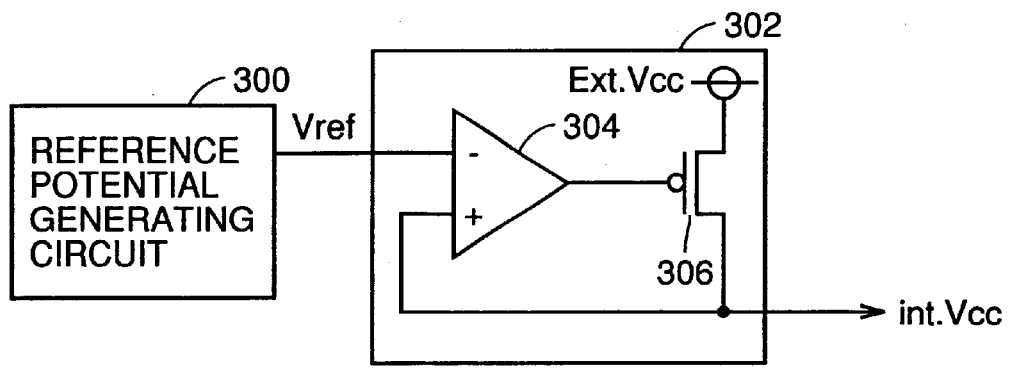
FIG. 15 is a circuit diagram representing a conventional general voltage down converter.
Figure 16:
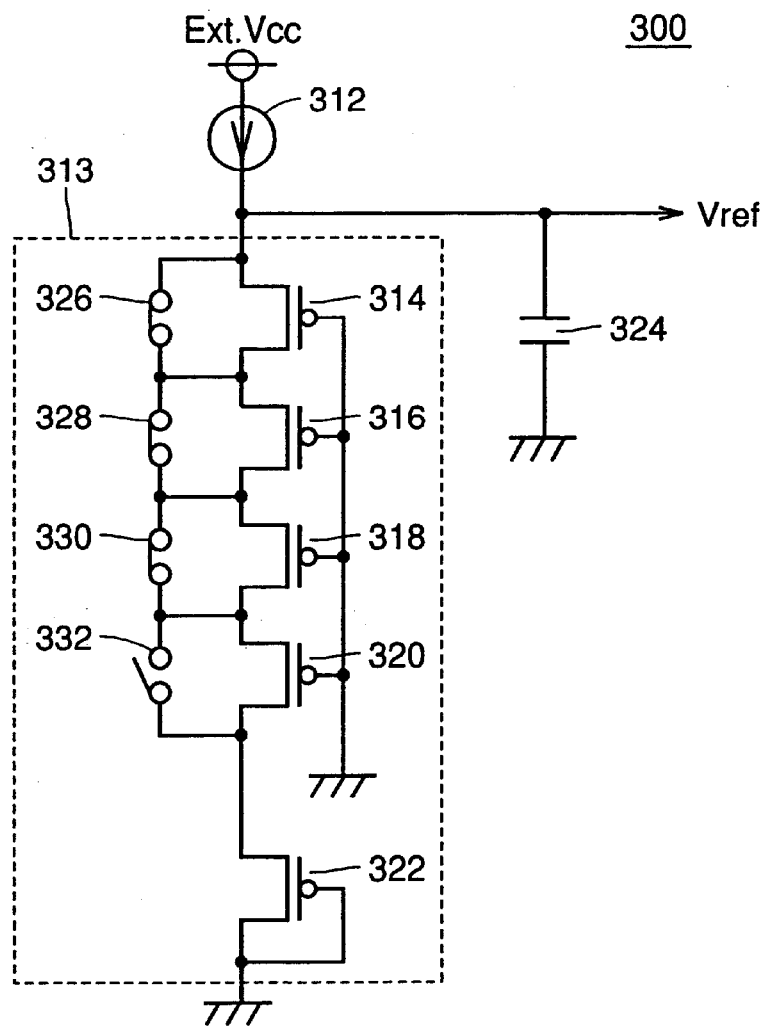
FIG. 16 is a circuit diagram representing a configuration of a reference potential generating circuit 300 of FIG. 15.
Figure 17:
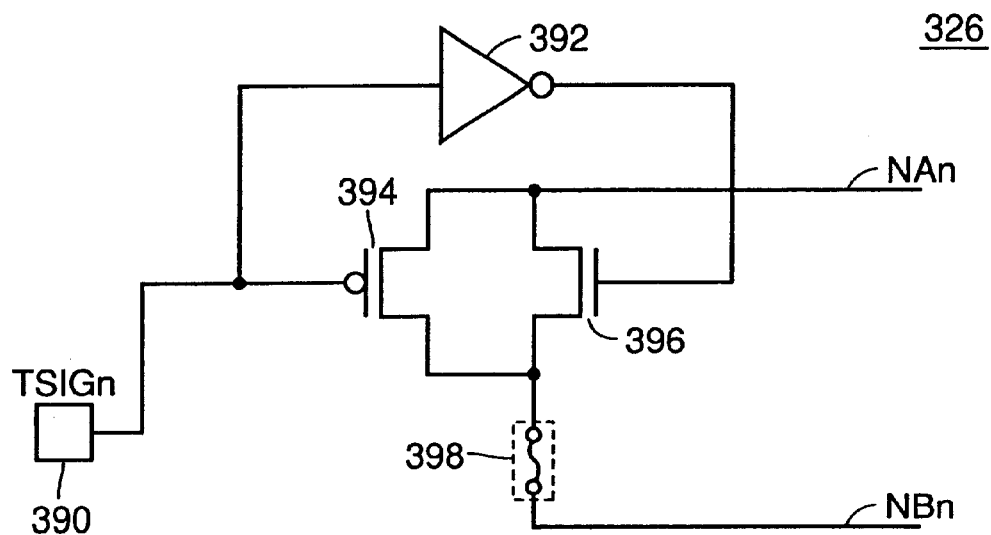
FIG. 17 is a circuit diagram representing a detailed configuration of switch circuit 326.
Figure 18:
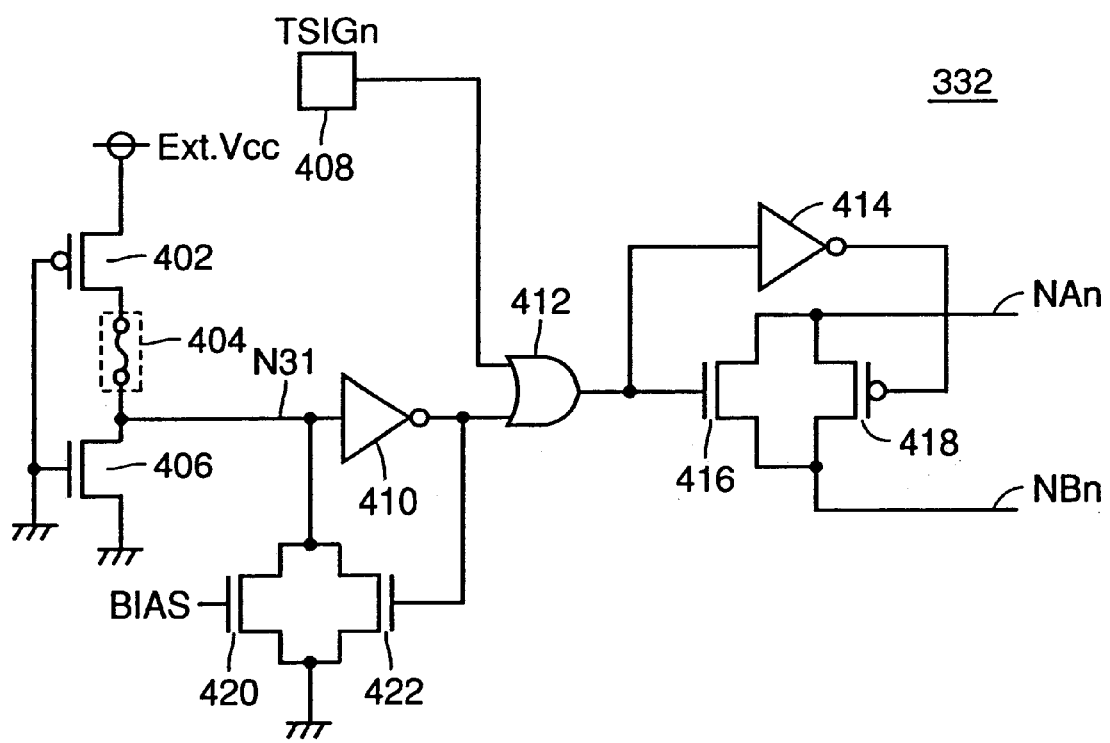
FIG. 18 is a circuit diagram representing a configuration of a switch circuit 332 of FIG. 16.

FIG. 14 is a diagram of waveforms representing the operation of the semiconductor device in accordance with the third embodiment.

Figure 11:
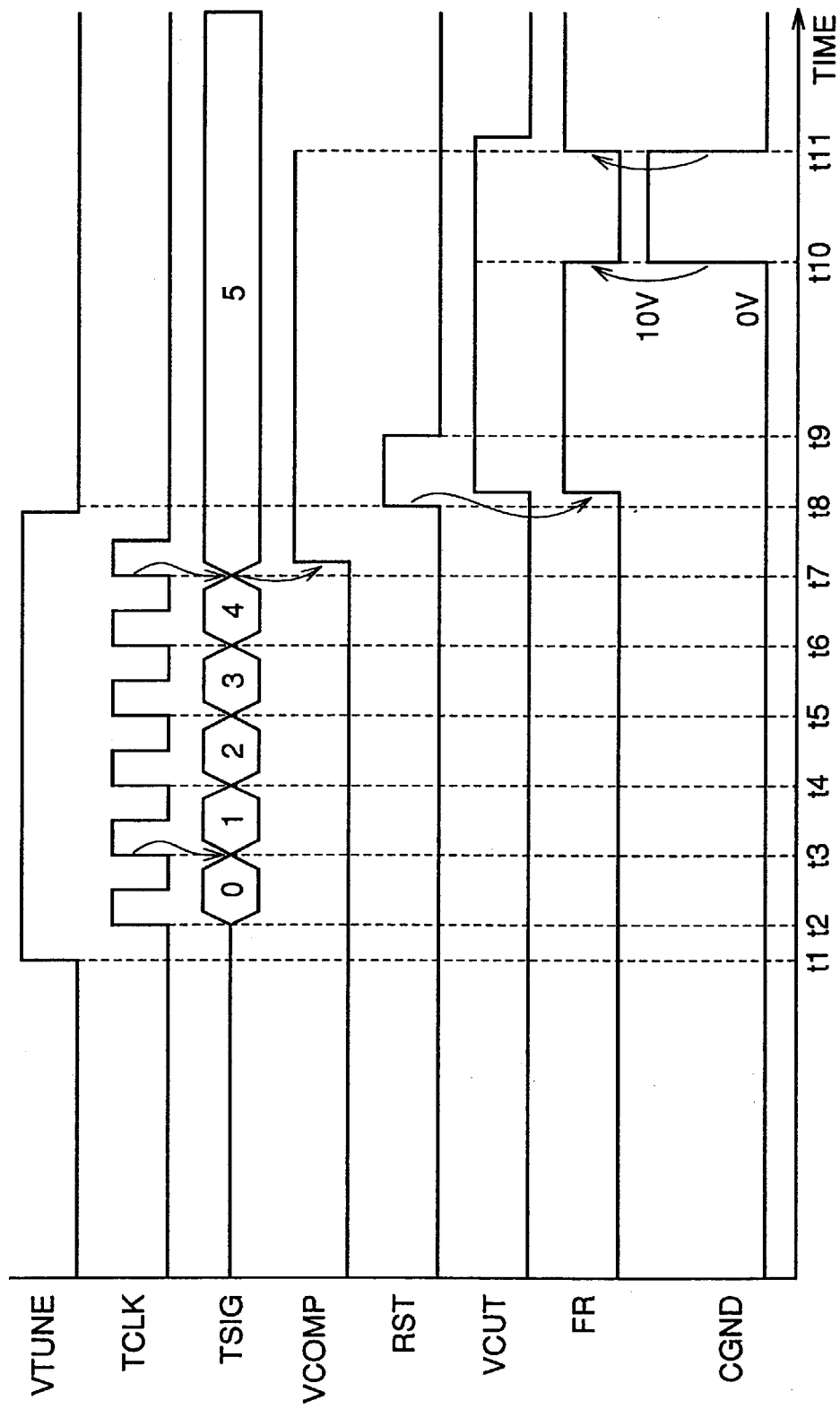
FIG. 11 is a diagram of waveforms related to the operation of the semiconductor device in accordance with a third embodiment.

Referring to FIGS. 9 and 11, from time t1 to t7, control signal TCLK is generated in the tuning mode, the level of internally generated reference potential Vref is compared with external reference potential Ext.Vref and the level is determined.

In this state, the potential of node N22 is at H level because of P channel MOS transistors 214 and 216, and therefore, the signal FR is at the L level. When tuning ends, the tuning mode signal VTUNE falls to the L level.

Thereafter, at time t8, an operation of blowing off the antifuse starts. First, reset signal RST is activated to the H level, node N23 is set to the L level, and through the N channel MOS transistor 222 which is conductive, node N22 attains to the L level. In response, the signal FR attains to the H level.

Thereafter, the signal VCUT for blowing off the antifuse is activated. At this time, when the corresponding tuning signal TSIGn is held in the state of H level, then H level is applied to the gate of N channel MOS transistor 228, and N channel MOS transistors 228 and 230 are both rendered conductive. Thereafter, even after reset signal RST falls at time t9, node N23 is kept at the L level, and hence the signal FR is kept at the H level.

Then, at time t10, in order to blow off antifuse 234, a high voltage of about 10V is applied to node CGND, which is in normal operation, at the ground potential. Then, the high voltage is applied only to that antifuse of which corresponding tuning signal TSIG is at the H level.

When insulation of antifuse 234 is lost, node N23 rises from the L level to the H level, and in response, the signal FR attains to the L level. Therefore, N channel MOS transistor 230 is rendered non-conductive, and therefore flow of current from node CGND to the ground node stops.

Thereafter, at time t11, the potential of node CGND is lowered to 0V and, in response, the potential of node N3 attains to the L level. Therefore, the signal FR returns to the H level. Blowing of the fuse ends, and the signal VCUT falls to the L level.

After time t11, as the corresponding antifuse has been blown off, the reference potential Vref set by the tuning signals TSIG1 to TSIG4 will be continuously output.

As the voltage level is tuned in this manner, it is unnecessary to monitor the reference potential Vref and the tuning signals TSIG1 to TSIG4. Therefore, the number of pads of the semiconductor device can be reduced. Further, as the antifuse is used, provision of a guard ring or the like is unnecessary, and hence the area of the fuse can be reduced. Further, the laser trimming apparatus is also unnecessary, and the step of tuning can be incorporated in the step of monitoring by the tester. As the tuning determination and the trimming can be performed collectively in the semiconductor device, the time for testing can be reduced.

Fourth Embodiment

Generally, a DRAM includes a refresh address counter. The DRAM has an operation mode in which a row address is applied from the refresh address counter contained therein.

In the fourth embodiment, the refresh address counter is used at the time of tuning. In the fourth embodiment, in place of refresh address counter 25 of semiconductor device 1 shown in FIG. 1, a refresh address counter 25a is provided.

Figure 12:
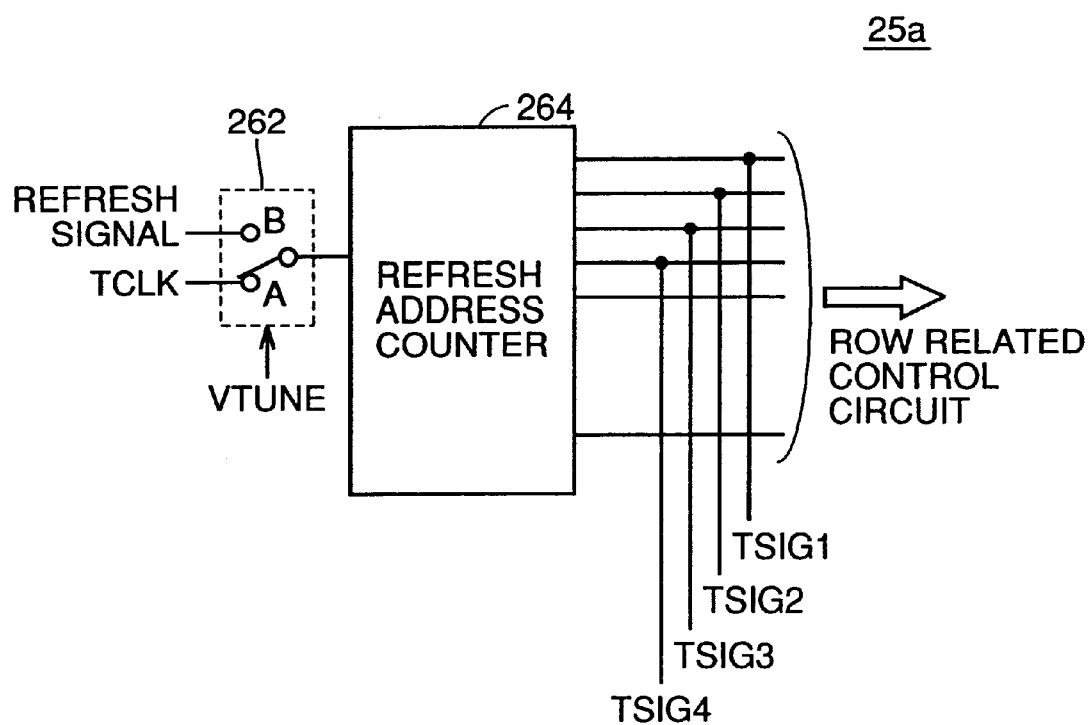

FIG. 12 is a schematic diagram representing configuration of the refresh address counter 25a.

Referring to FIG. 12, refresh address counter 25a includes a selection switch circuit 262 applying either a refresh signal or the control clock signal TCLK to refresh address counter 264 in response to tuning mode signal VTUNE. More specifically, refresh address counter 264 is used both at the time of refreshing and at the time of tuning.

In the normal operation, that is, when tuning mode signal VTUNE is at the L level, refresh address counter 264 operates as an n bit counter, receiving the refresh signal. Here, n represents the number of bits of the row address.

When the tuning mode signal VTUNE is at the H level, refresh address counter 264 counts the control clock signal TCLK. Refresh address counter 264 operates as a 4 bit counter. Least significant 4 bits of the output from refresh address counter 264 are taken out as tuning signals TSIG1 to TSIG4, and output to the reference potential generating circuit.

Figure 19:
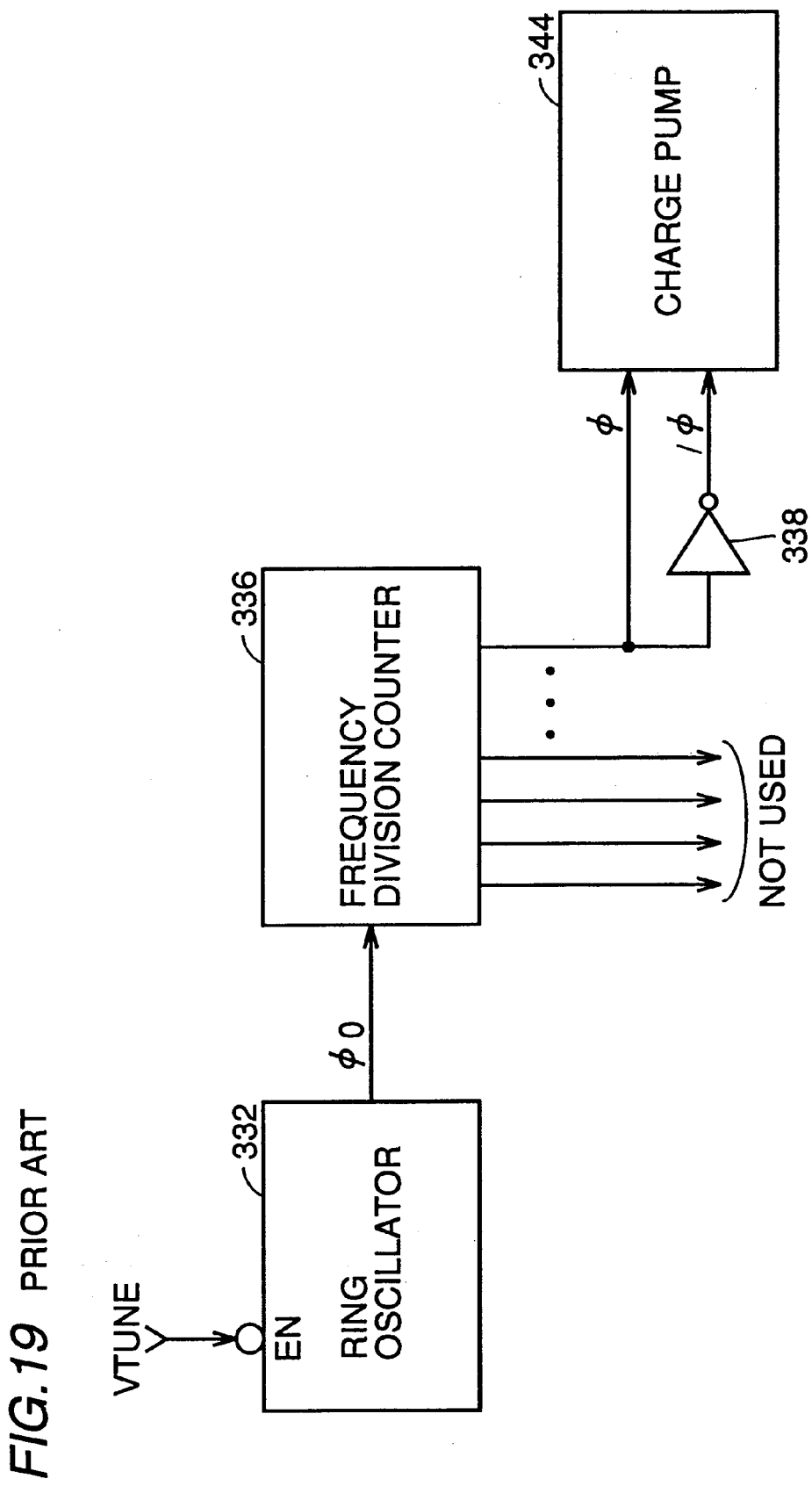
FIG. 19 is a block diagram representing a configuration of a boosted power supply circuit generating a boosted potential provided in a conventional semiconductor device.

In the tuning mode, generally, the refresh counter does not operate. Therefore, the refresh counter can be used for tuning. Further, a counter circuit other than the refresh counter is included in the DRAM. For example, a counter circuit is used at a portion for inputting a signal to a charge pump circuit in the boosted power supply circuit, as described with reference to FIG. 19.

Figure 13:
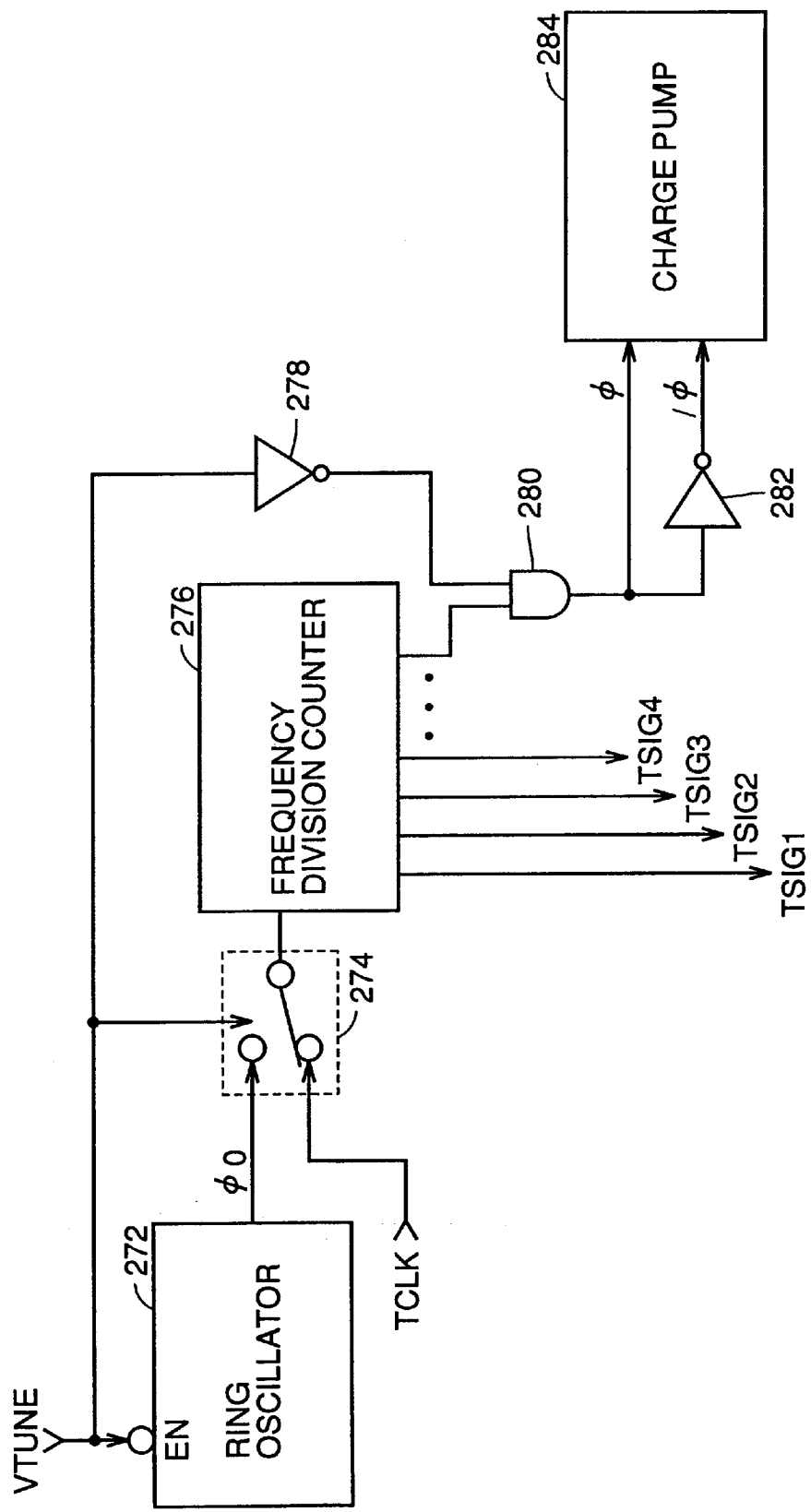
FIG. 13 is a circuit diagram representing a configuration using a counter of a boosted power supply generating circuit.

FIG. 13 is a circuit diagram representing a configuration in which the counter of the boosted power supply generating circuit is used.

Referring to FIG. 13, the boosted power supply circuit includes a ring oscillator 272 which is activated in a normal mode where tuning mode signal VTUNE is at the L level and outputting clock signal φ0, a selection switch circuit 274 selecting and outputting either the clock signal φ0 or the control clock signal TCLK in response to the tuning mode signal VTUNE, a frequency division counter 276 counting an output of selection switch circuit 274, an inverter 278 receiving and inverting the tuning mode signal VTUNE, an AND circuit 280 receiving the most significant bit of frequency division counter 276 and an output of inverter 278 and outputting a clock signal φ, an inverter 282 receiving an output of AND circuit 280 and outputting the clock signal/φ, and a charge pump 284 generating a high potential by clock signalsφ and /φ.

Here, least significant 4 bits of frequency division circuit 276 are normally not used. In the tuning mode, these bits are provided as 4-bit outputs of a frequency division counter counting the control clock signal TCLK, providing tuning signals TSIG1 to TSIG4 for the reference potential generating circuit.

As the counter circuit not used at the time of tuning reference potential Vref is switched and used, it becomes unnecessary to provide a separate counter circuit for tuning the reference potential Vref. Therefore, the number of circuit elements can be reduced and the area of the semiconductor device can be reduced.

Fifth Embodiment

In the fifth embodiment, in the structure of semiconductor device 1 shown in FIG. 1, a voltage down converter 38a is provided in place of voltage down converter 38.

FIG. 14 is a circuit diagram representing configuration of voltage down converter 38a.

Referring to FIG. 14, voltage down converter 38 includes a reference potential generating circuit 52 generating the reference potential Vref, a voltage converting unit 54 receiving the reference potential Vref, and converting external power supply potential Ext.Vcc to a corresponding internal power supply potential int.Vcc, and a potential stabilizing circuit 290 connected to an output of reference potential generating circuit 52. Voltage converting unit 54 includes a differential amplifier circuit 56 receiving at a positive input the internal power supply potential int.Vcc and receiving at a negative input the reference potential Vref, and a P channel MOS transistor 58 receiving at its gate an output of differential amplifier circuit 56 and connected between a power supply node to which external power supply potential Ext.Vcc is applied and a power supply node to which internal power supply potential int.Vcc is applied.

Voltage stabilizing circuit 290 includes a P channel MOS transistor 292 and a capacitor 294 connected in series between an output node of reference potential generating circuit 52 outputting the reference potential Vref and the ground node. The tuning mode signal VTUNE is applied to the gate of P channel MOS transistor 292.

Reference potential generating circuit 52, which handles very small current, is thus very sensitive to noise. Therefore, in the normal operation state where the semiconductor device operates at a high speed and a large current flows, a capacitor 294 which is a stabilizing capacitance, is necessary to prevent coupling noise from adjacent interconnections.

At the time of tuning the level of the reference potential Vref, however, the time becomes necessary to charge the capacitor 294, which is the stabilizing capacitor, for changing the level of reference potential Vref. This means that the period of the control clock signal TCLK must be made longer, resulting in longer test time. In the tuning mode, it is possible to stop operations of unnecessary circuits, so as to prevent consumption of large current by the semiconductor device, and hence capacitor 294 is unnecessary. Therefore, by the configuration shown in FIG. 14, in the tuning mode, that is, when the tuning mode signal VTUNE attains to the H level, the capacitor 294 can be disconnected from the reference potential generating circuit 52. Accordingly, the time for charging capacitor 294 becomes unnecessary, and the level of the reference potential Vref can be changed quickly. Therefore, the period of the control clock signal TCLK can be made shorter, and hence the test time can be made shorter.

Sixth Embodiment

Figure 20:
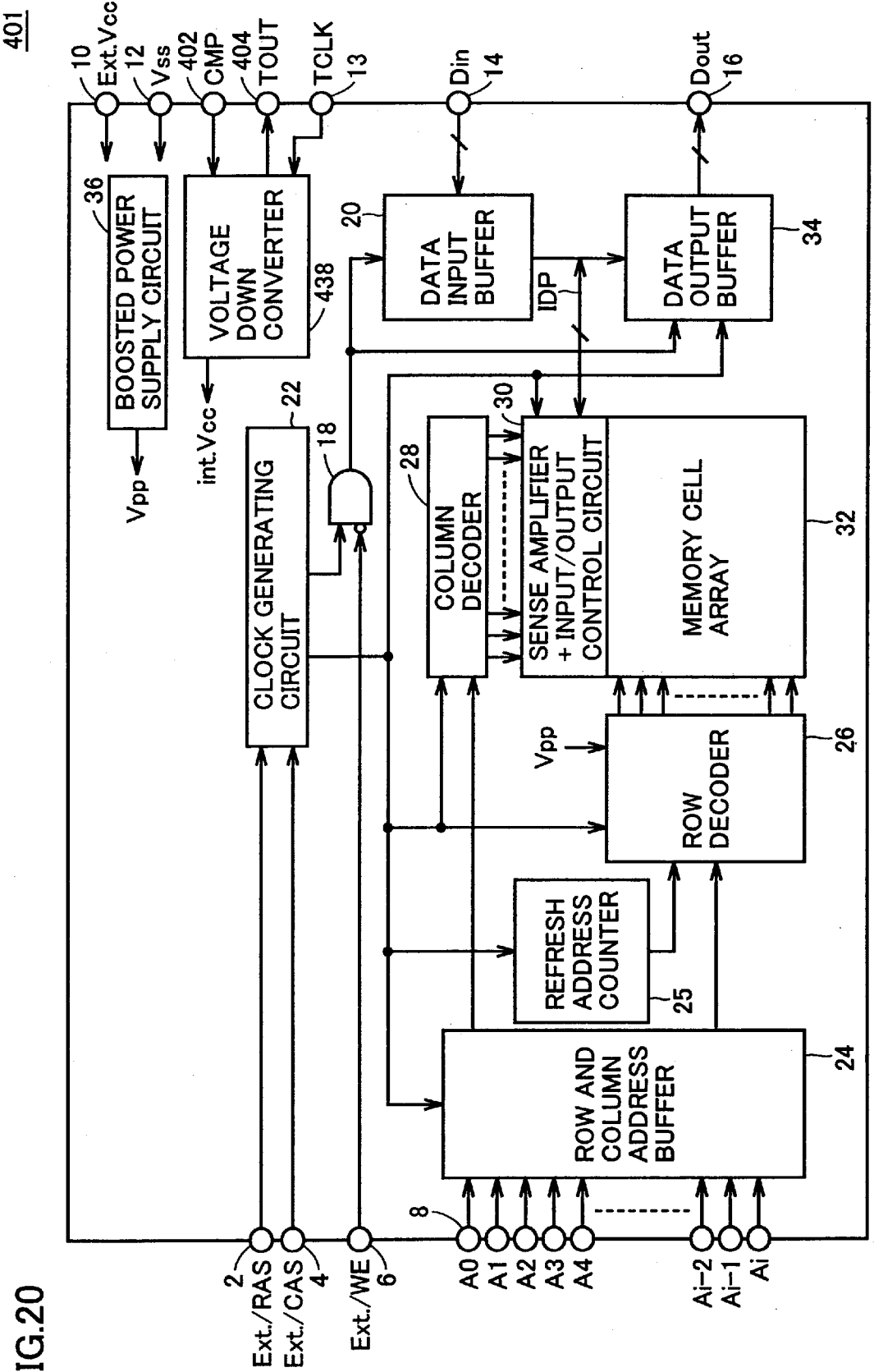
FIG. 20 is a block diagram representing a configuration of a semiconductor device 401 in accordance with a sixth embodiment.

FIG. 20 is a block diagram representing a configuration of a semiconductor device 401 in accordance with the sixth embodiment.

Referring to FIG. 20, semiconductor device 401 includes, in the configuration of semiconductor device 1 shown in FIG. 1, a voltage down converter 438 in place of voltage down converter 38, and additionally includes a terminal 402 receiving a comparing potential CMP from the outside and a terminal 404 outputting a test output signal TOUT to the outside.

Voltage down converter 438 gradually changes an internal reference potential in accordance with the signal TCLK, and outputs the relation of magnitude between the generated reference potential and the externally applied comparing potential CMP as a test output signal TOUT. Configuration of other portions of semiconductor device 401 is the same as that of semiconductor device 1 shown in FIG. 1, and therefore, description thereof will not be repeated.

Figure 21:
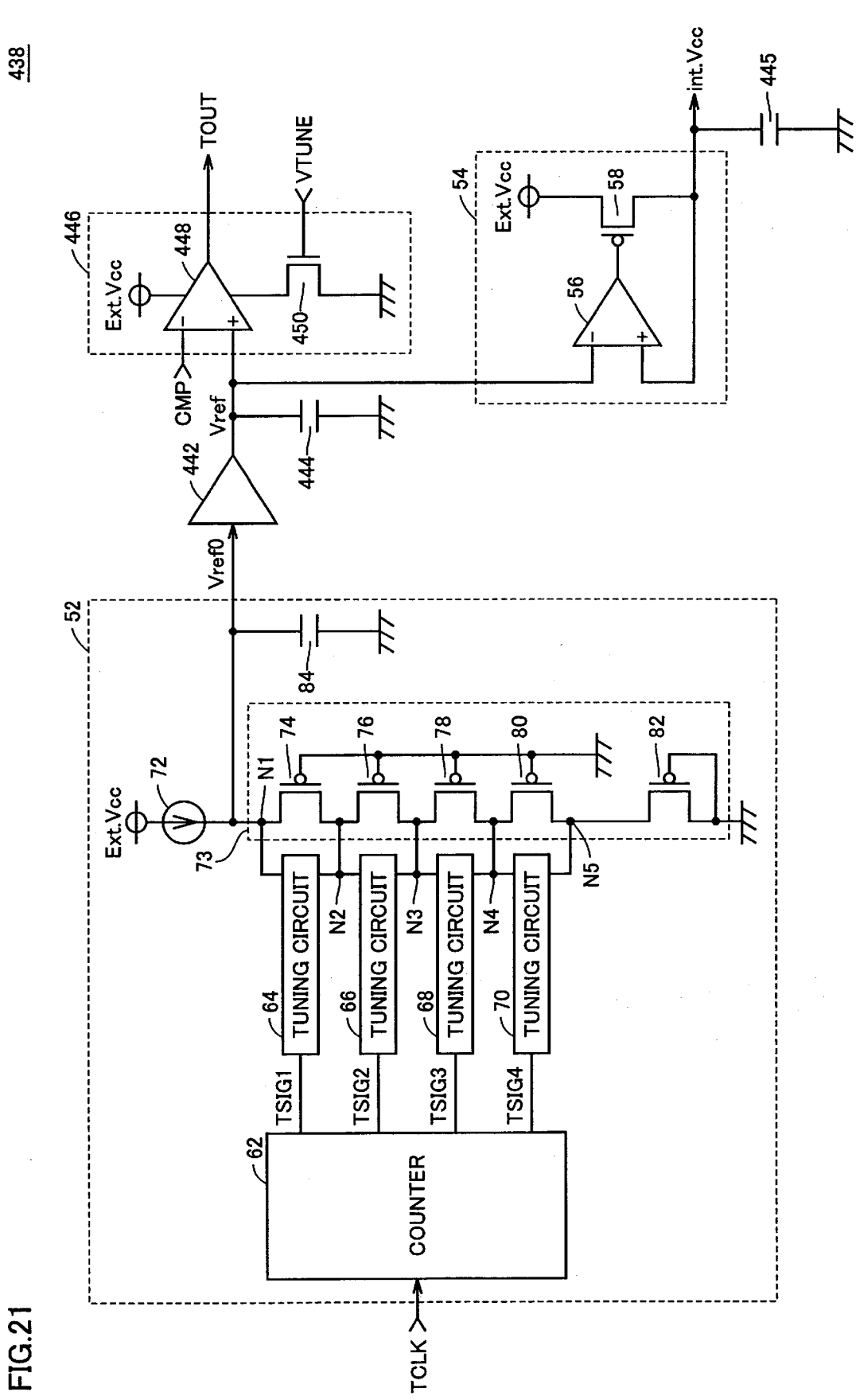
FIG. 21 is a circuit diagram representing a configuration of a voltage down converter 438 of FIG. 20.

FIG. 21 is a circuit diagram representing a configuration of voltage down converter 438 shown in FIG. 20.

Referring to FIG. 21, voltage down converter 438 includes: a reference potential generating circuit 52 outputting a reference potential Vref0 in response to the signal TCLK; a buffer circuit 442 receiving reference potential Vref0 and outputting a reference potential Vref; a capacitor 444 connected between an output of buffer circuit 442 and a ground node; a level determining circuit 446 activated when the signal VTUNE is at the H level, receiving the reference potential Vref and an externally applied comparing potential CMP, determining magnitude of the received two potentials and providing the result as a test output signal TOUT; a voltage converting unit 54 receiving reference potential Vref and outputting power supply potential int.Vcc; and a capacitor 445 connected between an output of voltage converting unit 54 and the ground node.

Buffer circuit 442 provides an output potential having the same potential as the input potential and lower impedance. Buffer circuit 442 can be implemented, for example, by using a current mirror circuit.

Reference potential generating circuit 52 outputs reference potential Vref0. The configuration of this circuit has already been described with reference to FIG. 3, and therefore, description thereof will not be repeated.

Further, voltage converting unit 54 has a configuration similar to that of voltage converting unit 54 shown in FIG. 2. Therefore, description thereof will not be repeated.

Level determining circuit 446 includes: a comparator 448 receiving the comparing potential CMP at a negative input node and the reference potential Vref at a positive input node and providing the test output signal TOUT; and an N channel MOS transistor 450 connected between comparator 448 and the ground node and receiving at its gate the signal VTUNE. N channel MOS transistor 450 is rendered conductive in the tuning mode, and provides operation current flowing from external power supply potential Ext.Vcc through comparator 448 to the ground node. Not in the tuning mode, N channel MOS transistor 450 is rendered nonconductive, cutting the operational power supply voltage of comparator 448.

Reference potential generating circuit 52 is capable of tuning the reference potential Vref0 in 16 steps, by changing the signals TSIG1 to TSIG4 in accordance with the signal TCLK in the tuning mode, that is, when the signal VTUNE is at the H level. The reference potential Vref0 output from reference potential generating circuit 52 is input to buffer circuit 442. Buffer circuit 442 is formed by using a current mirror circuit, for example, such that an input node is separated from an output node. The reference potential Vref output from buffer circuit 442 is applied to level determining circuit 446 and voltage converting unit 54.

Level determining circuit 446 has its comparator 448 activated only when the signal VTUNE is at the H level. When activated, comparator 448 compares the comparing potential CMP input from the outside of the device with the internally generated reference potential Vref. When Vref<CMP as a result of comparison, the test signal TOUT attains to the L level, and when Vref>CMP, the test output signal TOUT attains to the H level.

In the example shown in FIG. 21, signals TSIG1 to TSIG4 are switched in synchronization with the signal TCLK. Alternatively, the signals may be provided by applying an external input signal in the tuning mode.

Figure 22:
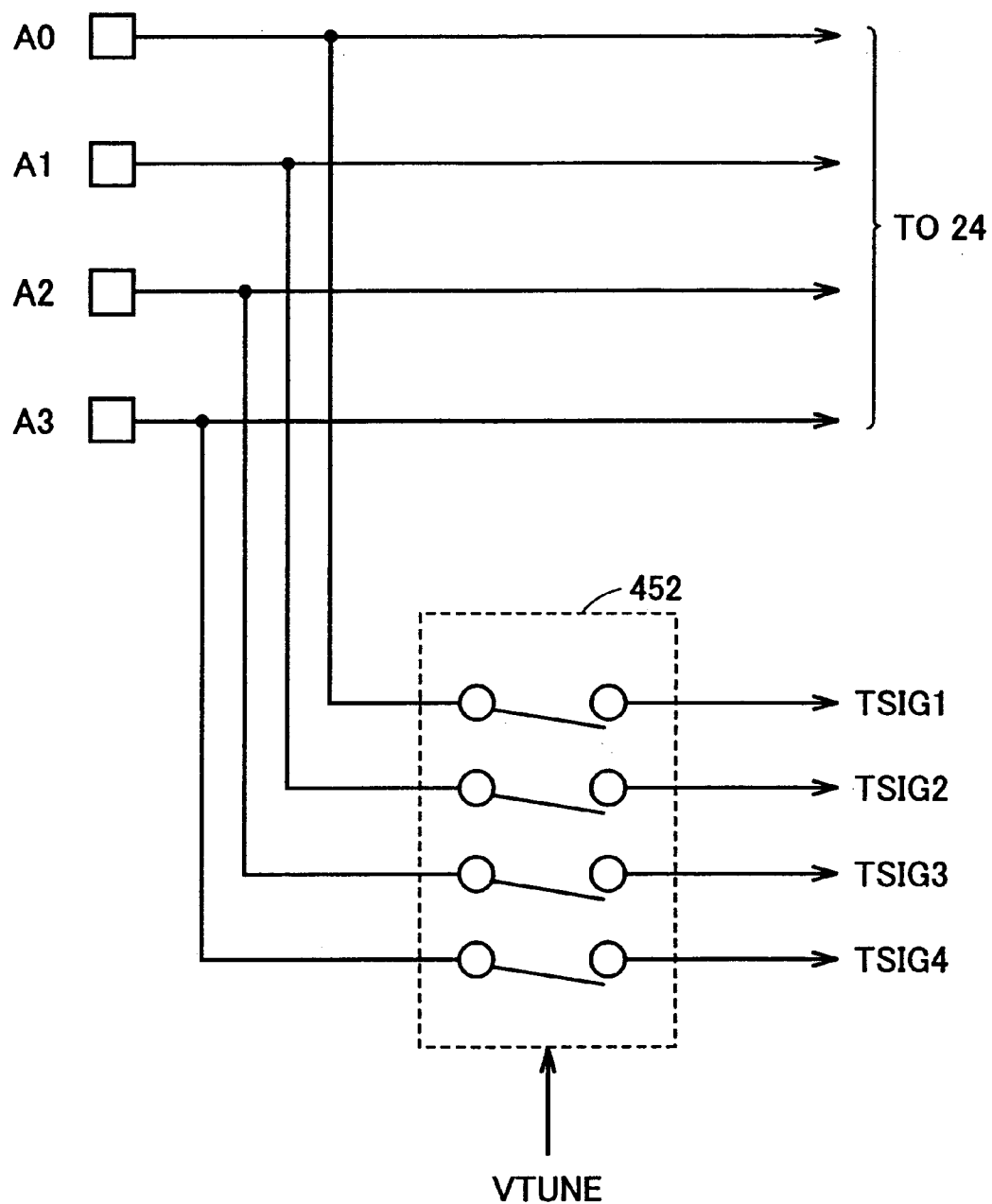
FIG. 22 shows an exemplary configuration for applying signals TSIG1 to TSIG4 using an external input signal.

FIG. 22 shows an example in which the signals TSIG1 to TSIG4 are applied by using an external input signal.

Referring to FIG. 22, address signals A0 to A3 are generally used for providing signals to row and address buffer 24 shown in FIG. 20. By providing a switch circuit 452, it is possible to input signals TSIG1 to TSIG4 directly from four terminals applying address signals A0 to A3, only when the signal VTUNE is at the H level.

Figure 23:
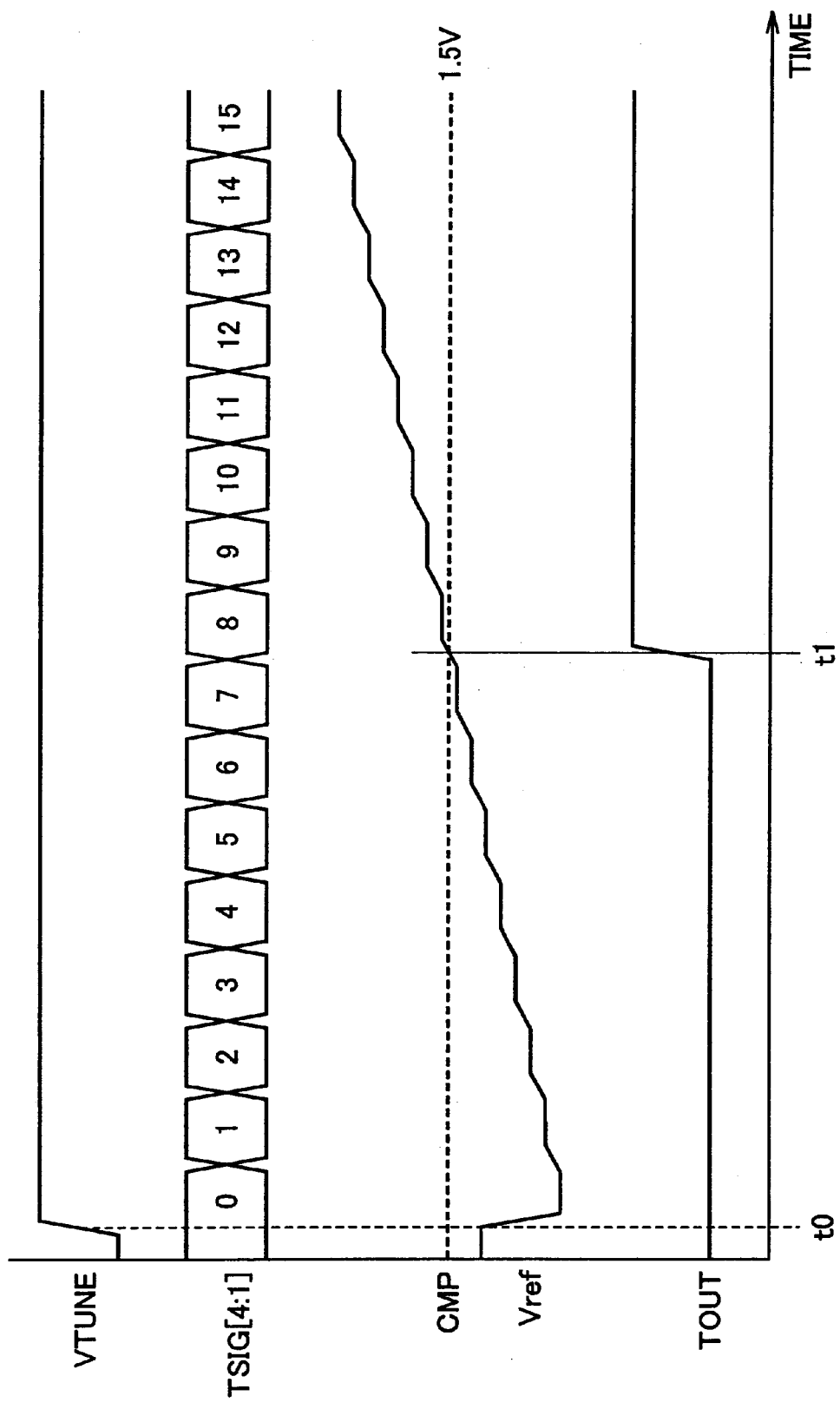
FIG. 23 is a diagram of waveforms related to the operation of voltage down converter 438 shown in FIG. 21.

FIG. 23 is a diagram of waveforms representing an operation of voltage down converter 438 shown in FIG. 21.

Referring to FIGS. 21 and 23, at time. t0, the signal VTUNE is set from the L level to the H level, and the semiconductor device enters the tuning mode. As a target potential of reference potential Vref, an external comparing potential CMP is applied. In FIG. 23, the comparing potential CMP of 1.5V is shown as an example.

By incrementing the signal TSIG [4:1] from 0 in turn, the value of the internally generated reference potential Vref is changed, and the test output signal TOUT is monitored. The monitoring is performed, for example, by the tester for a semiconductor device.

When the value of the signal TSIG [4:1] changes from 7 to 8 at time t1, the value of reference potential Vref which has been smaller than the comparing potential CMP becomes larger than the comparing potential CMP. The test signal TOUT representing the result of comparison changes from the L level to the H level. The tuning code at which TOUT changes from the L level to the H level is the optimal code.

When the reference potential Vref having high output impedance generated in the chip is to be compared by a comparator provided in a tester in accordance with conventional practice, the comparator input is susceptible to noise through a test jig for connecting the semiconductor device and the tester or through a semiconductor package. Therefore, it is necessary to perform measurements several times and to determine based on the average value.

By contrast, in the invention according to the sixth embodiment, the comparator is provided inside the device. Therefore, determination of the magnitude of the reference potential Vref can be performed stably, without any influence of external noise. This reduces test time. Further, as it is unnecessary to output the reference potential Vref to the outside of the device, the noise generated on reference potential Vref can be reduced.

Seventh Embodiment

The embodiment according to the seventh embodiment includes, in addition to the invention according to the sixth embodiment, a circuit for initializing the reference potential Vref.

Figure 24:
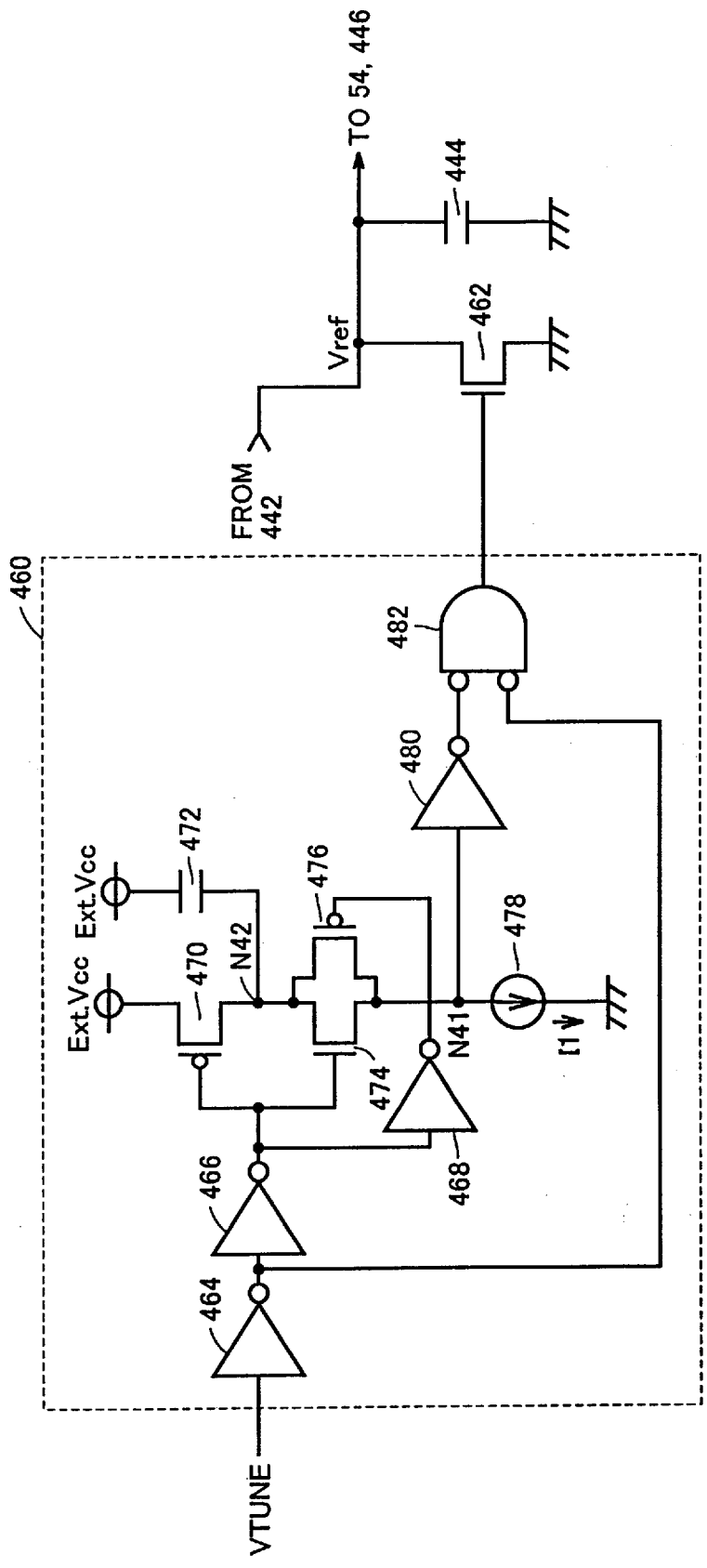
FIG. 24 is a circuit diagram representing a configuration of a Vref initializing circuit.

FIG. 24 is a circuit diagram representing the configuration of the Vref initializing circuit.

Referring to FIG. 24, the Vref initializing circuit includes a one shot pulse generating circuit 460, and an N channel MOS transistor 462 connected between a node receiving the reference potential Vref from buffer circuit 442 of FIG. 21 and the ground node, and receiving at its gate an output of one shot pulse generating circuit 460.

One shot pulse generating circuit 460 includes an inverter 464 receiving the signal VTUNE, an inverter 466 receiving and inverting an output of inverter 464, and an inverter 468 receiving and inverting an output of inverter 466.

One shot pulse generating circuit 460 further includes: a P channel MOS transistor 470 connected between a node receiving external power supply potential Ext.Vcc and a node N42 and receiving at its gate the output of inverter 466; a capacitor 472 connected between a node receiving external power supply potential Ext.Vcc and node N42; an N channel MOS transistor 474 connected between nodes N42 and N41 and receiving at its gate the output of inverter 466; and a P channel MOS transistor 476 connected between nodes N42 and N41 and receiving at its gate an output of inverter 468.

One shot pulse generating circuit 460 further includes a constant current source 478 connected between node N41 and the ground node and providing a constant current I1, an inverter 480 having an input connected to node N41, and an NOR circuit 482 receiving outputs of inverters 480 and 464. An output of NOR circuit 482 is connected to the gate of N channel MOS transistor 462.

The Vref initializing circuit shown in FIG. 24 is for connecting the node to which the reference potential Vref generated by voltage down converter 438 of FIG. 21 is applied to the ground node for a prescribed time period, to draw out the charges in capacitor 444.

When the signal VTUNE is at the L level, transistor 470 is conductive while transistors 474 and 476 are non-conductive, node N42 is at the H level and the node N41 is at the L level. At this time, NOR circuit 482 outputs an L level signal, and transistor 462 is non-conductive.

When the signal VTUNE changes from the L level to the H level, transistor 470 is rendered non-conductive and transistors 474 and 476 are rendered conductive. The potential at node N42 is transmitted to node N41, so that node N41 temporarily attains to the H level. Then, NOR circuit 482 outputs an H level signal, so that transistor 462 is rendered conductive. Then, the node to which reference potential Vref is applied is connected to the ground node. There is a constant current source 478 between node N41 and the ground node, which provides a small current I1. Charges in capacitor 472 are drawn out through transistors 474, 476 by current source 478. After a prescribed time period, node N41 attains to the L level, and the output of NOR circuit 482 returns to the L level signal. Transistor 462 is rendered conductive, and initialization of reference potential Vref is canceled.

At a node providing reference potential Vref, generally, a stabilizing capacitor such as represented by capacitor 444 is provided in order to reduce influence of noise from adjacent interconnections and the like. Therefore, even when tuning code is changed to start tuning and setting the reference potential Vref0 low, the reference potential Vref does not immediately decrease.

By connecting transistor 462 shown in FIG. 24 in parallel with stabilizing capacitor 444 connected to reference potential Vref, it becomes possible to set the reference potential Vref at the ground potential for a prescribed time period when setting the tuning mode. Accordingly, charges of stabilizing capacitor 444 connected to the node providing reference potential Vref can be drawn out immediately. Thus, the time necessary for changing reference potential Vref from a high level to a low level can be reduced.

Figure 25:
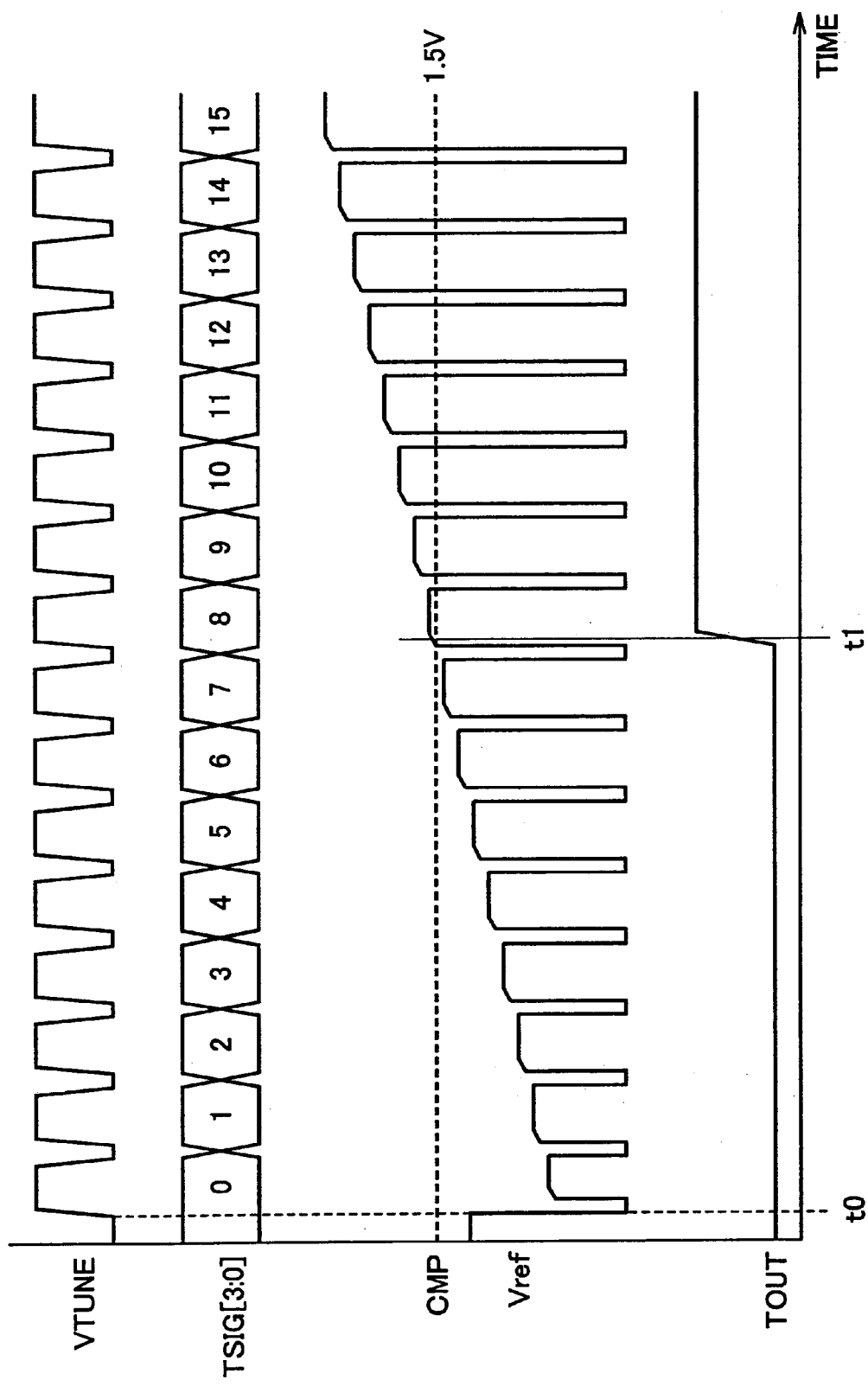
FIG. 25 is a diagram of waveforms representing a control in which a signal VTUNE is changed from the L level to the H level at every change of the signal TSIG.

FIG. 25 is a diagram of waveforms representing a control in which the signal VTUNE is changed from L to H level at every change of the signal TSIG.

Referring to FIG. 25, when the tuning mode is set, at time t0, the potential Vref is set to the L level immediately, and therefore, the tuning operation can be started immediately. Further, when the signal VTUNE is changed from the L level to the H level at every change of the signal TSIG, it becomes possible to obtain the tuning value by using binary search method, for example, which can further reduce the test time.

Eighth Embodiment

In the sixth and seventh embodiments, reference potential Vref is compared with externally applied comparing potential CMP. It is possible, however, to compare the power supply potential int.Vcc generated by the voltage down converter with the comparing potential CMP.

Figure 26:
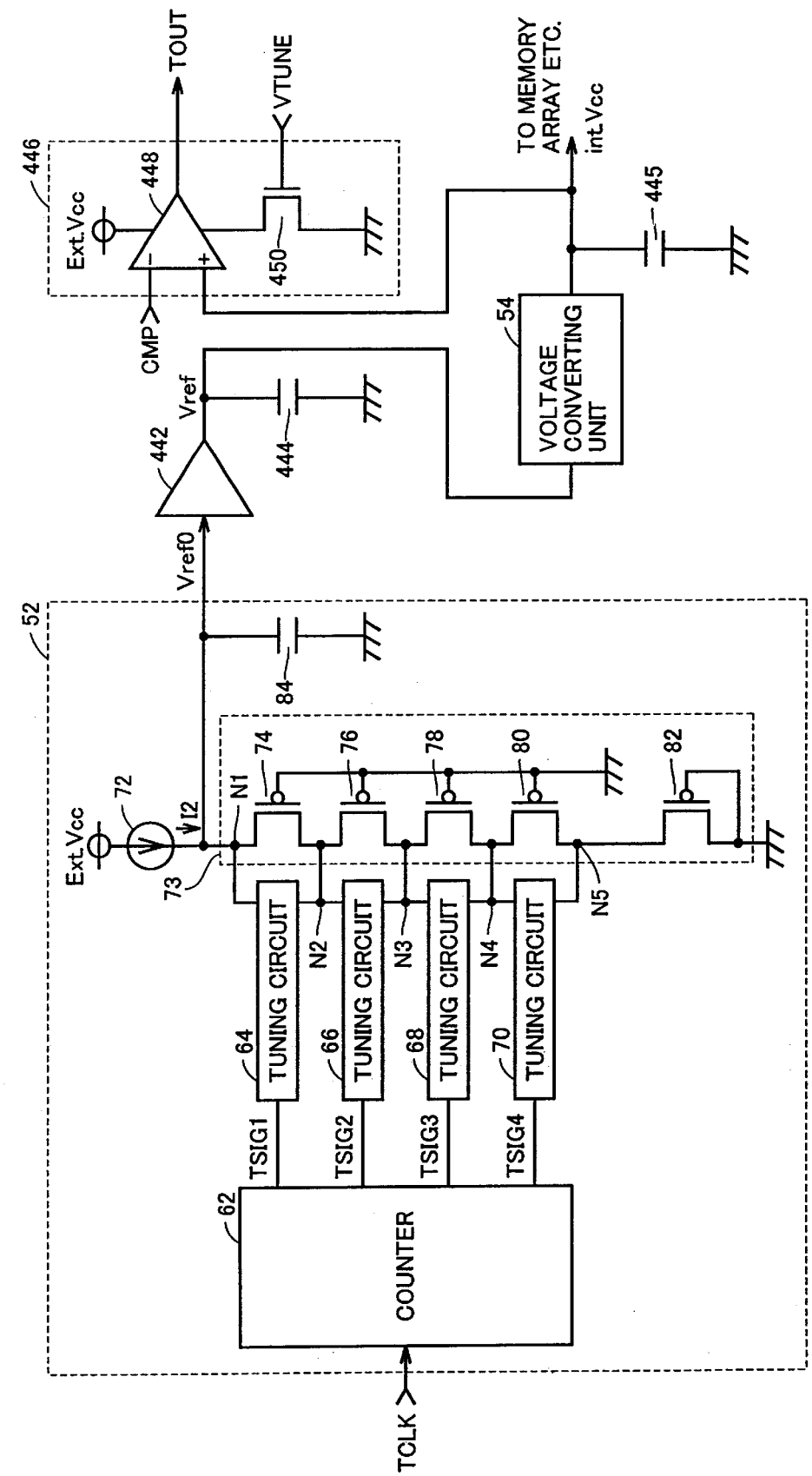
FIG. 26 is a circuit diagram representing a configuration of a voltage down converter 438a used in an eighth embodiment.

FIG. 26 is a circuit diagram representing a configuration of a voltage down converter 438a used in the eighth embodiment.

Referring to FIG. 26, voltage down converter 438a is different from the configuration of voltage down converter 438 shown in FIG. 21 in that level determining circuit 446 receives internal power supply potential int.Vcc, in place of the reference potential Vref. Except for this point, the configuration is the same as that of voltage down converter 438 shown in FIG. 21. Therefore, description thereof will not be repeated.

Internal power supply potential int.Vcc represents an internal power supply potential generated at voltage converting unit 54 using reference potential Vref as a reference, and used in the peripheral circuitry and in the memory array. Level determining circuit 446 compares power supply potential int.Vcc with the externally applied comparing potential CMP.

Further, by connecting the initializing circuit such as shown in the seventh embodiment to an output node of power supply potential int.Vcc, the test time can be reduced. Particularly, the voltage converting unit 54 does not have any driving transistor pulling down the output node to the L level as shown in FIG. 2, and therefore, the effect of adding the initializing circuit is significant. When it is necessary to set Vref once to a high potential and then to a low potential for binary search, for example, the node outputting int.Vcc may be initialized at every comparing operation.

Figure 27:
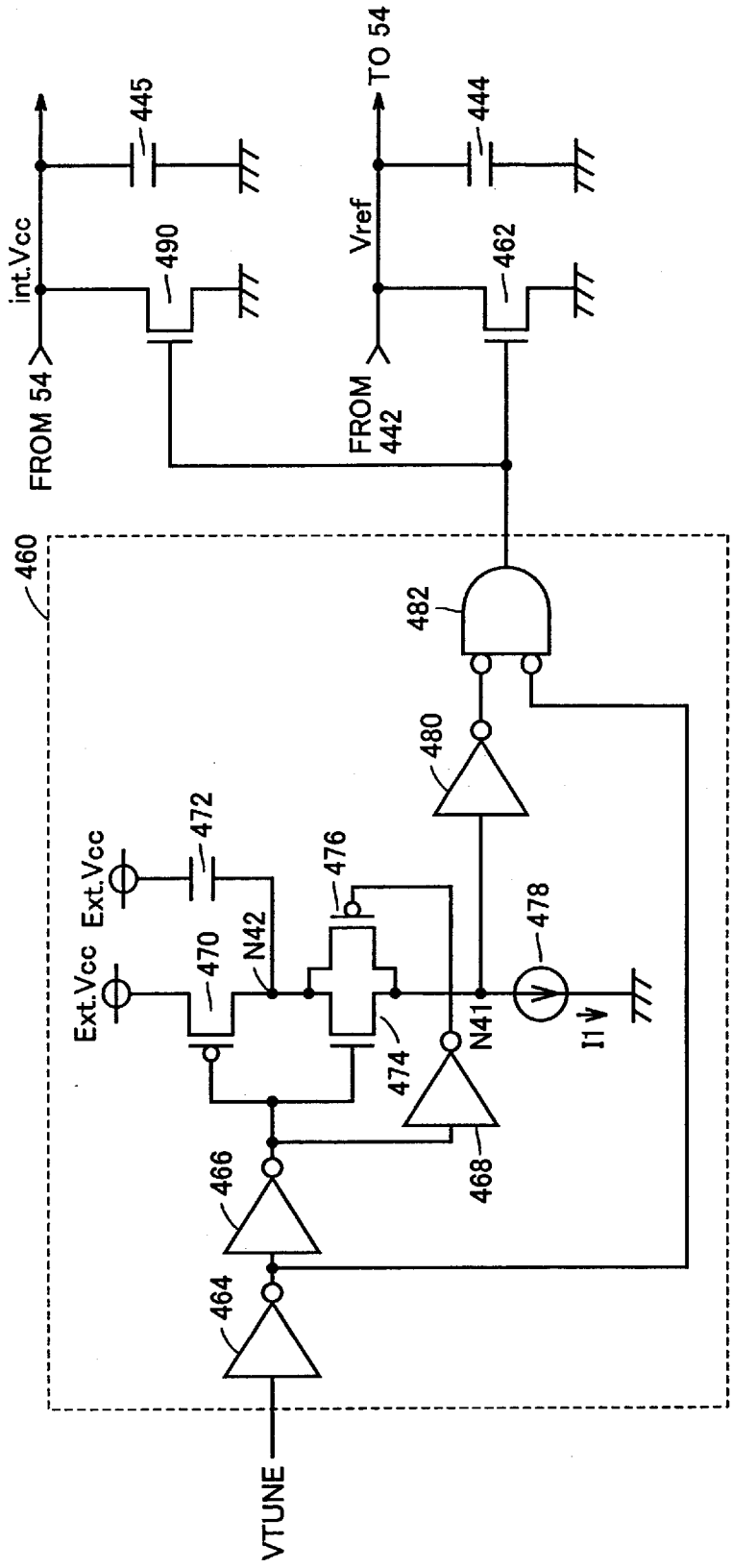
FIG. 27 shows an example in which the initializing circuit is additionally applied to a node outputting power supply potential int.Vcc.

FIG. 27 shows an example in which the initializing circuit is applied additionally to the node outputting the power supply potential int.Vcc.

Referring to FIG. 27, the initializing circuit includes, in addition to the configuration of the initializing circuit shown in FIG. 24, an N channel MOS transistor 490 connected between the node outputting internal power supply potential int.Vcc and the ground node and receiving at its gate an output of NOR circuit 482. By rendering conductive the transistor 490, it is possible to draw out charges of stabilizing capacitor 445.

Further, when external power supply potential Ext.Vcc is put into the semiconductor device, sometimes there is generated an unstable period.

Figure 28:
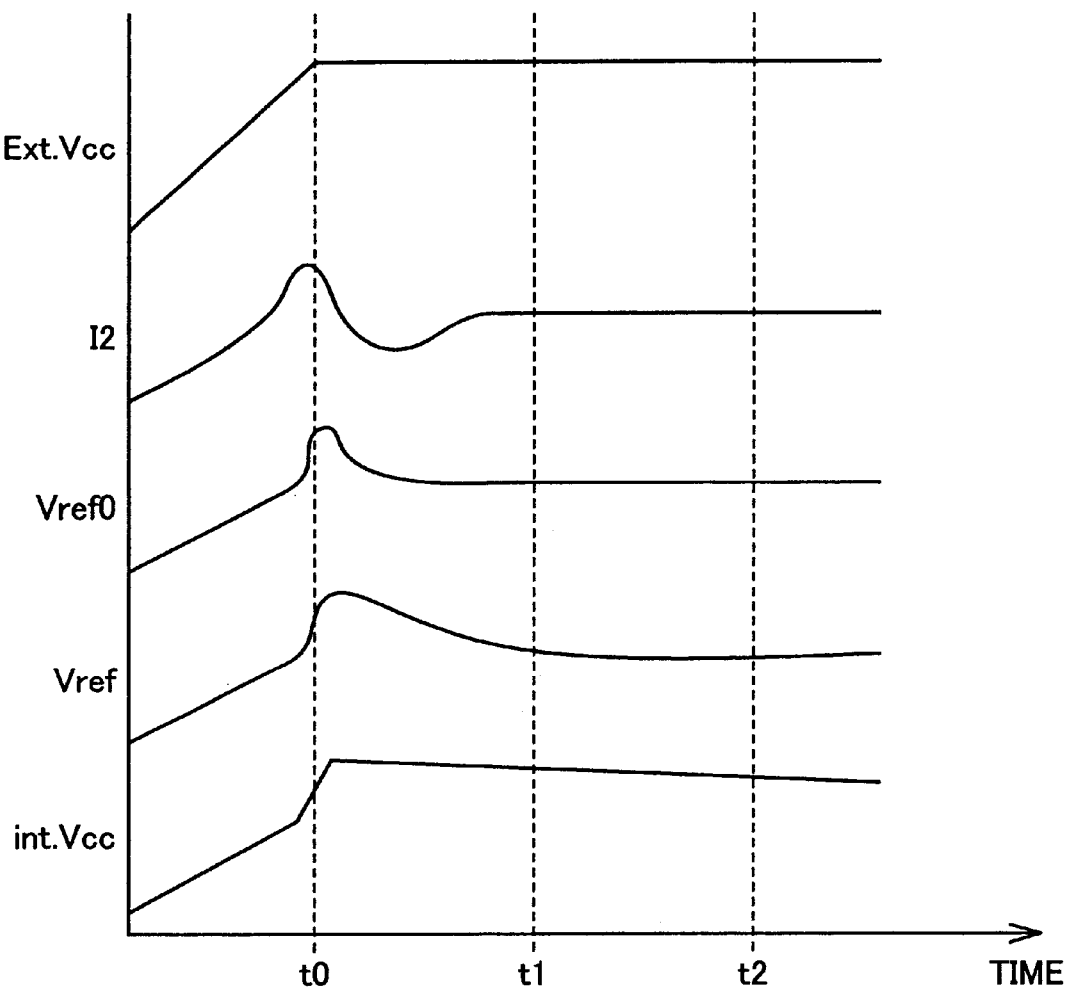

FIG. 28 shows various internal potentials when external power supply potential Ext.Vcc is applied.

Referring to FIG. 28, at time t0, when the current I2 of current source 72 temporarily increases, reference potential Vref0 becomes higher and, accordingly, reference potential Vref and power supply potential int.Vcc come to have higher levels. Generally, the capacitance value of stabilizing capacitor satisfies C (Vref0)<<C (Vref)<<C (int.Vcc). Here, C (Vref0) corresponds to capacitor 84 of FIG. 26, C (Vref) corresponds to capacitor 444 and V (int.Vcc) corresponds to capacitor 445. As capacitor 445 has large capacitance value, it takes time for once increased power supply potential int.Vcc to attain a lower level. Therefore, it becomes difficult to start tuning immediately. Therefore, it is necessary to wait until time T1 of FIG. 28 for reference potential Vref to be stabilized, and it is necessary to wait until time t2 for power supply potential int.Vcc to be stabilized.

By using the initializing circuit such as shown in FIG. 27, the wait time at the time of power on can be reduced, and further effect is obtained in addition to the effect described with reference to the seventh embodiment.

Ninth Embodiment

The level determining circuit in accordance with the sixth embodiment is also applicable to the boosted power supply potential Vpp generated inside the semiconductor device.

Figure 29:
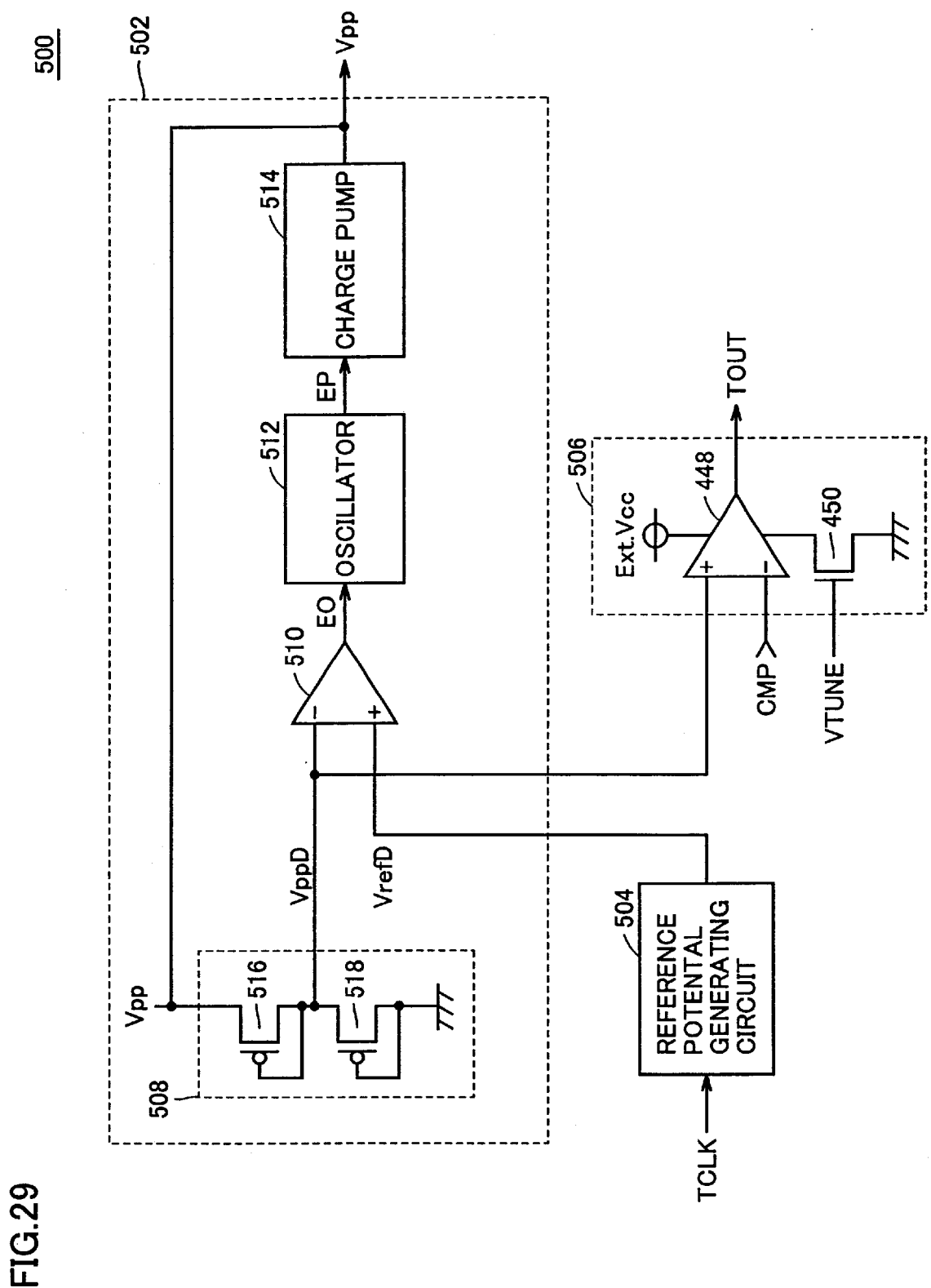
FIG. 29 shows a configuration of a boosted power supply circuit 500 provided with a level determining circuit.

FIG. 29 shows a configuration of the boosted power supply circuit 500 including a level determining circuit.

Boosted power supply circuit 500 includes: a reference potential generating circuit 504 generating a reference potential VrefD in response to the signal TCLK; a boosted potential generating unit 502 outputting the boosted potential Vpp in accordance with an output of reference potential generating circuit 504; and a level determining circuit 506 receiving the potential VppD from boosted potential generating unit 502 and comparing the potential with an externally applied comparing potential CMP, and providing the result of comparison as a test output signal TOUT.

The configuration of level determining circuit 506 is the same as that of level determining circuit 446 shown in FIG. 21, and therefore, description thereof will not be repeated.

Boosted potential generating unit 502 includes: a voltage dividing circuit 508 dividing boosted potential Vpp; a comparing circuit 510 comparing a potential VppD output from voltage dividing circuit 508 with reference potential VrefD; an oscillator 512 outputting a clock signal EP in response to an enable signal E0 output from comparing circuit 510; and a charge pump 514 feeding charges to a node that outputs boosted potential Vpp in response to activation of the clock signal EP. Oscillator 512 and charge pump 514 are activated in response to an output of comparing circuit 510 and boost the node providing Vpp to a target potential.

The boosted potential Vpp is higher than external power supply potential Ext.Vcc. The boosted potential Vpp is used for a word line driver, a data line separating circuit, a data output circuit and the like in, for example, a DRAM. The boosted potential Vpp boosted by charge pump 514 is applied to voltage dividing circuit 508. In voltage dividing circuit 508, the boosted potential Vpp is subjected to voltage division by P channel MOS transistors 516, 518 diode connected in series from the node to which boosted potential Vpp is applied to the ground node.

Comparing circuit 510 compares the potential VppD with the potential VrefD and, when VppD<VrefD, activates the activation signal E0 to the H level, and drives the charge pump circuit with the clock signal EP output from the oscillator.

Figure 30:
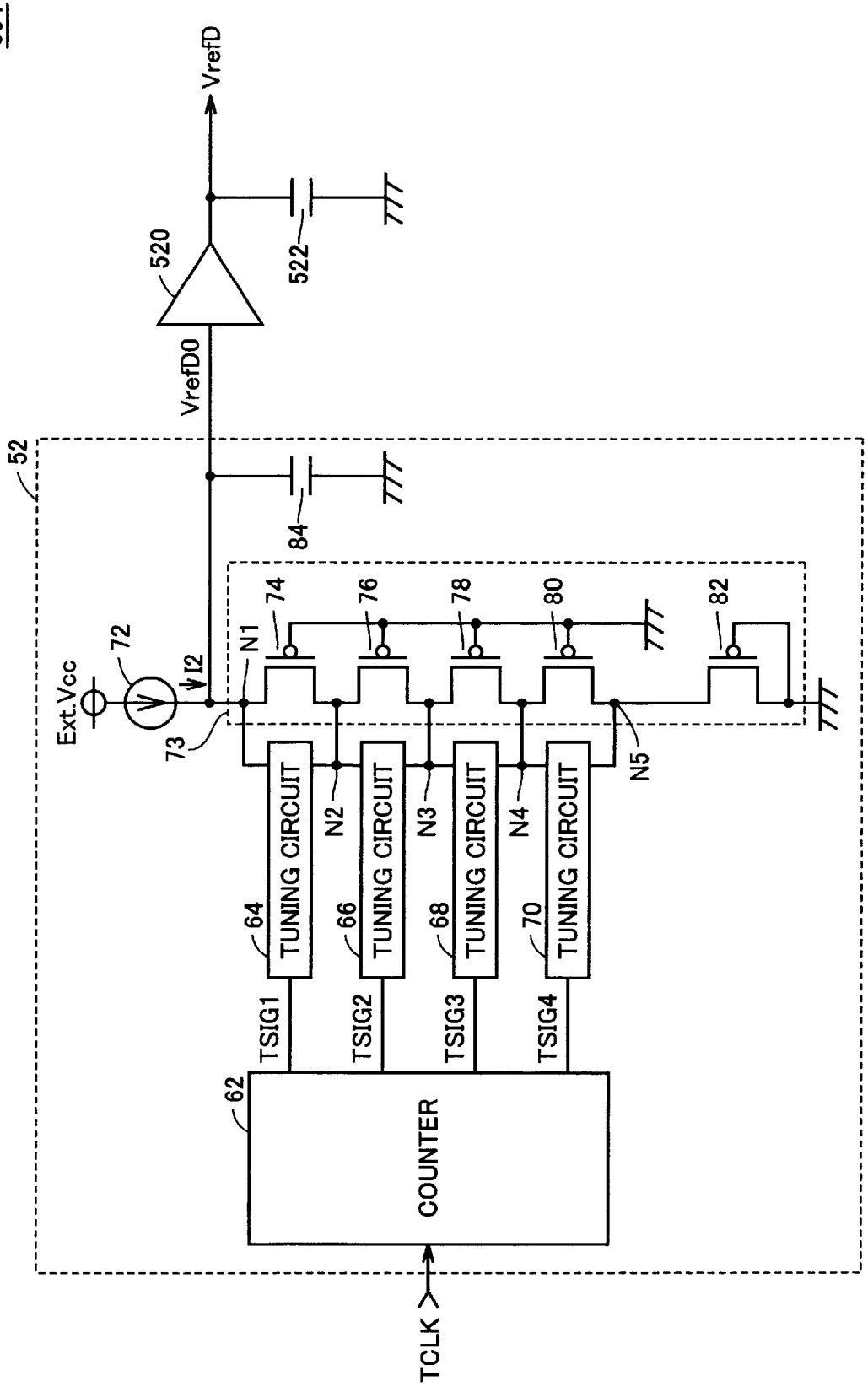
FIG. 30 is a circuit diagram showing a configuration of a reference potential generating circuit 504 shown in FIG. 29.

FIG. 30 is a circuit diagram representing a configuration of reference potential generating circuit 504 shown in FIG. 29.

Referring to FIG. 30, reference potential generating circuit 504 includes a reference potential generating circuit 52 outputting a reference potential VrefD0 in response to the signal TCLK, a buffer circuit 520 receiving the reference potential VrefD0 and outputting the reference potential VrefD with lower impedance, and a capacitor 522 for stabilization connected between an output of buffer circuit 520 and the ground node. The configuration of reference potential generating circuit 52 is the same as that of FIG. 3, and therefore description thereof is not repeated.

Figure 31:
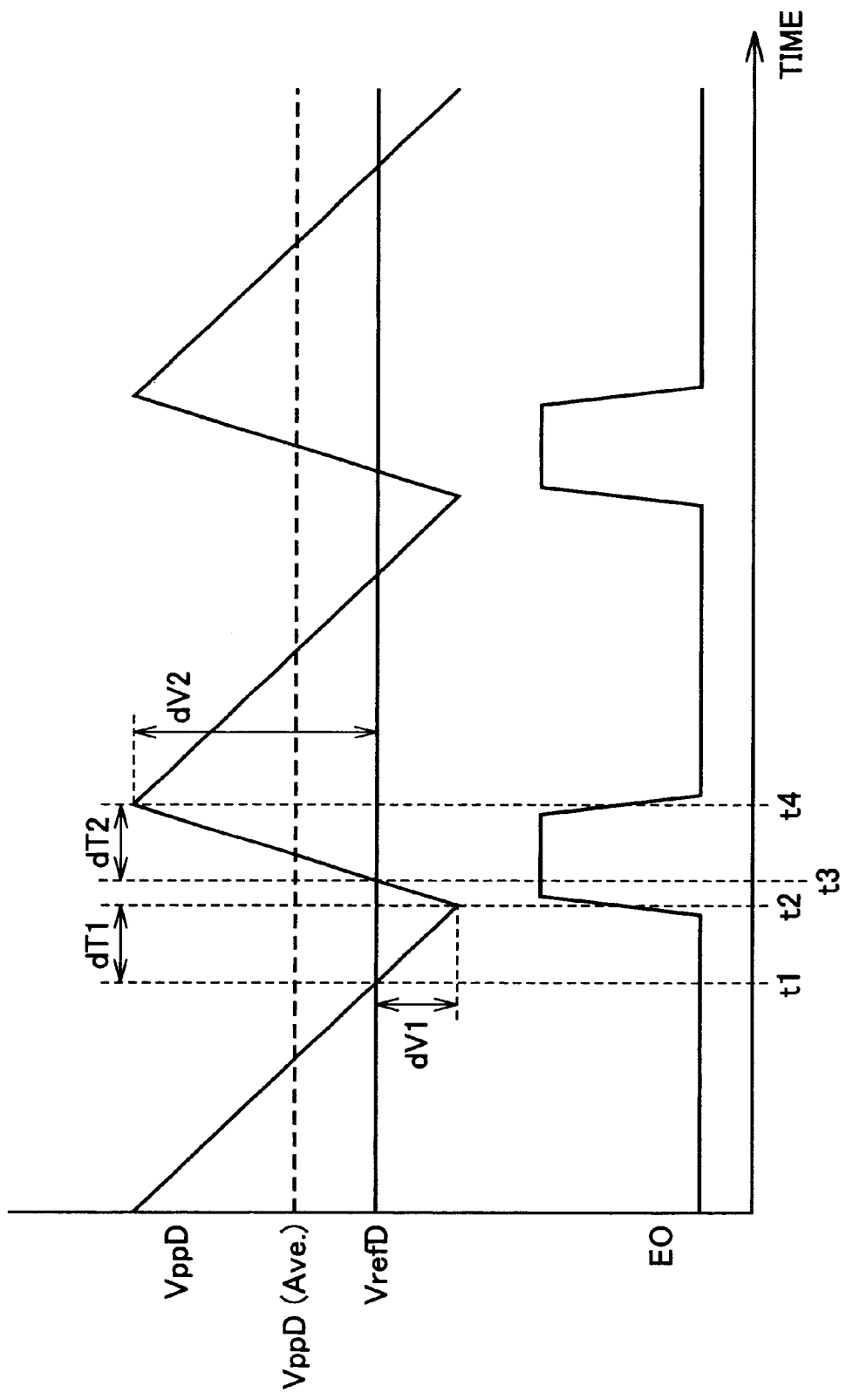
FIG. 31 is a diagram of waveforms related to the operation of the boosted power supply circuit 500 shown in FIG. 29.

FIG. 31 is a diagram of waveforms representing the operation of boosted power supply circuit 500 shown in FIG. 29.

Referring to FIGS. 29 and 31, when the boosted potential Vpp slowly lowers because of current consumption by a load circuit and when the potential VppD becomes lower than the reference potential VrefD at time T1, comparing circuit 510 responds at time t2, so that the signal E0 attains to the H level. Here, it takes a response time dT1 for the response of the comparator. Then, charge pump 514 operates, quickly supplying charges, whereby the boosted potential Vpp increases.

When the boosted potential Vpp becomes higher than the reference potential VrefD at time t3, the signal E0 attains to the L level at time t4, that is, after the response time dT2, and the charge pump stops. As the rate of decrease and increase of the boosted potential differ, the potential changes dV1 and dV2 differ even when necessary response time dT1 is equal to the response time dT2, for the response of the comparator. Therefore, the average value of potential VppD (Ave.) is not equal to the reference potential VrefD.

Therefore, in order to set the average value of boosted potential Vpp exactly at a prescribed level, it is preferable to input the potential VppD to level determining circuit 506, rather than the reference potential VrefD. Determination by comparison between the reference potential VrefD with the externally applied comparing potential CMP has lower accuracy than determination by comparison between the potential VppD with the externally applied comparing potential CMP for adjusting the code value providing reference potential Vref. The reason for this is that deviation between the average value of potential Vpp and the reference potential VrefD would not be considered when applying the comparing potential CMP.

In the tuning mode, that is, when the signal VTUNE is at the H level, comparison with the externally input comparing potential CMP is performed. The result is provided as test output signal TOUT, and in the similar manner as the sixth embodiment, optimal value for tuning is obtained. When a circuit for setting the boosted potential Vpp to the ground potential for a prescribed time period is mounted as in the seventh embodiment, the effect of further reduction of the test time is attained.

Tenth Embodiment

Though the potential VppD output from voltage dividing circuit 508 is input to the level determining circuit in the ninth embodiment, the voltage dividing circuit may be provided independently.

Figure 32:
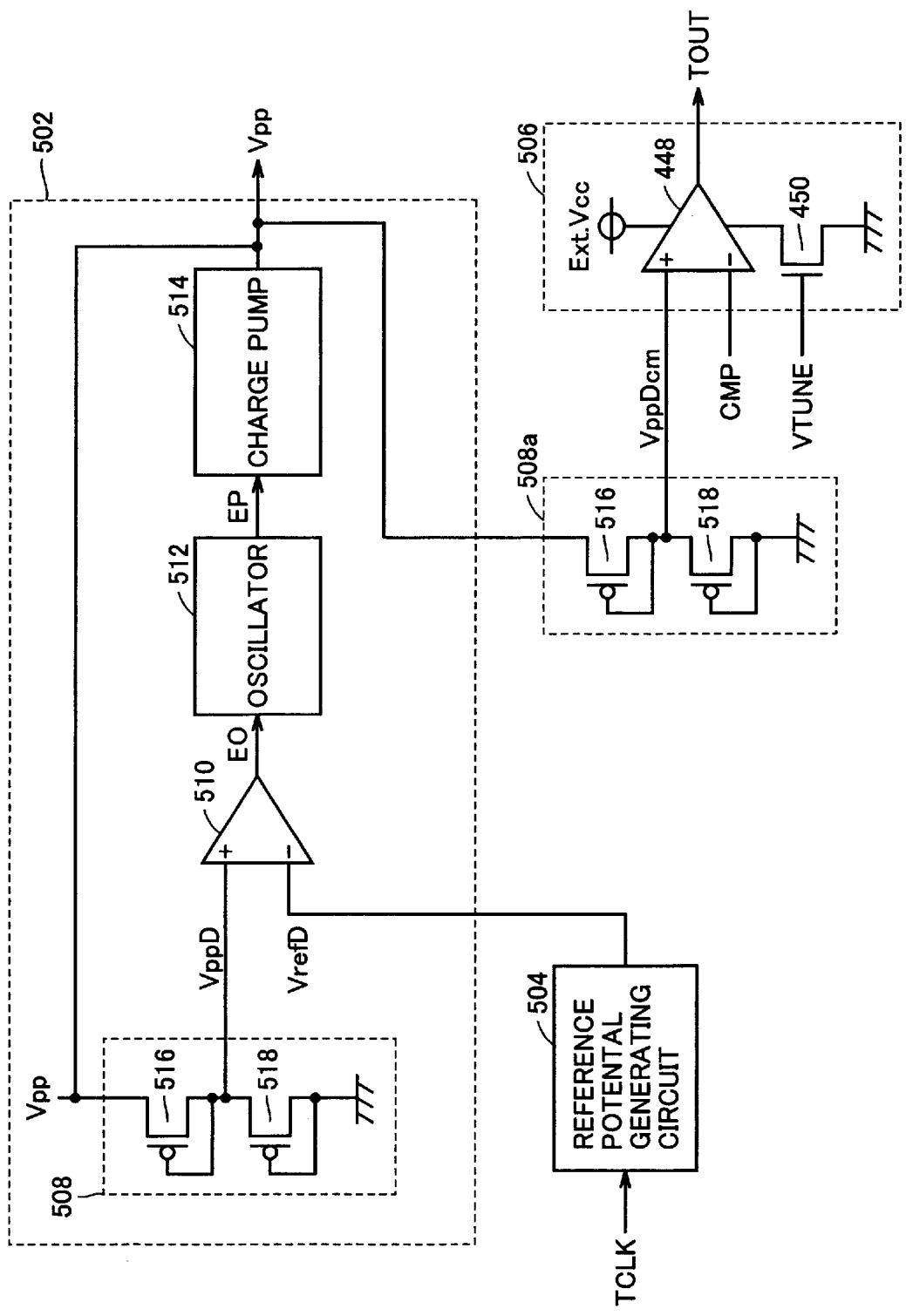
FIG. 32 is a circuit diagram showing a configuration of a boosted power supply circuit 500a which is a modification of boosted power supply circuit 500.

FIG. 32 is a circuit diagram representing a configuration of boosted power supply circuit 500a which is a modification of boosted power supply circuit 500.

Referring to FIG. 32, boosted power supply circuit 500a includes, in addition to the configuration of boosted power supply circuit 500 shown in FIG. 29, a voltage dividing circuit 508a. Voltage dividing circuit 508a divides the boosted potential Vpp and outputs a potential VppDcm. Level determining circuit 506 receives the potential Vpp-Dcm output from voltage dividing circuit 508a, in place of the output of voltage dividing circuit 508. Except for this, the configuration of boosted power supply circuit 500a is the same as that of boosted power supply circuit 500 shown in FIG. 29, and therefore, description thereof will not be repeated. Further, the configuration of voltage dividing circuit 508a is the same as that of voltage dividing circuit 508, and therefore description thereof will not be repeated. Voltage dividing circuit 508 as a part of potential generating unit 502 cannot always be arranged close to the level determining circuit 506 because of limitation of circuit layout, for example. Therefore, by arranging a voltage dividing circuit 508a, which is used only for monitoring at the time of tuning, near the level determining circuit 506, the effect of the ninth embodiment can be attained and, in addition, influence of resistance component or capacitance component of signal lines can be reduced.

Eleventh Embodiment

Figure 33:
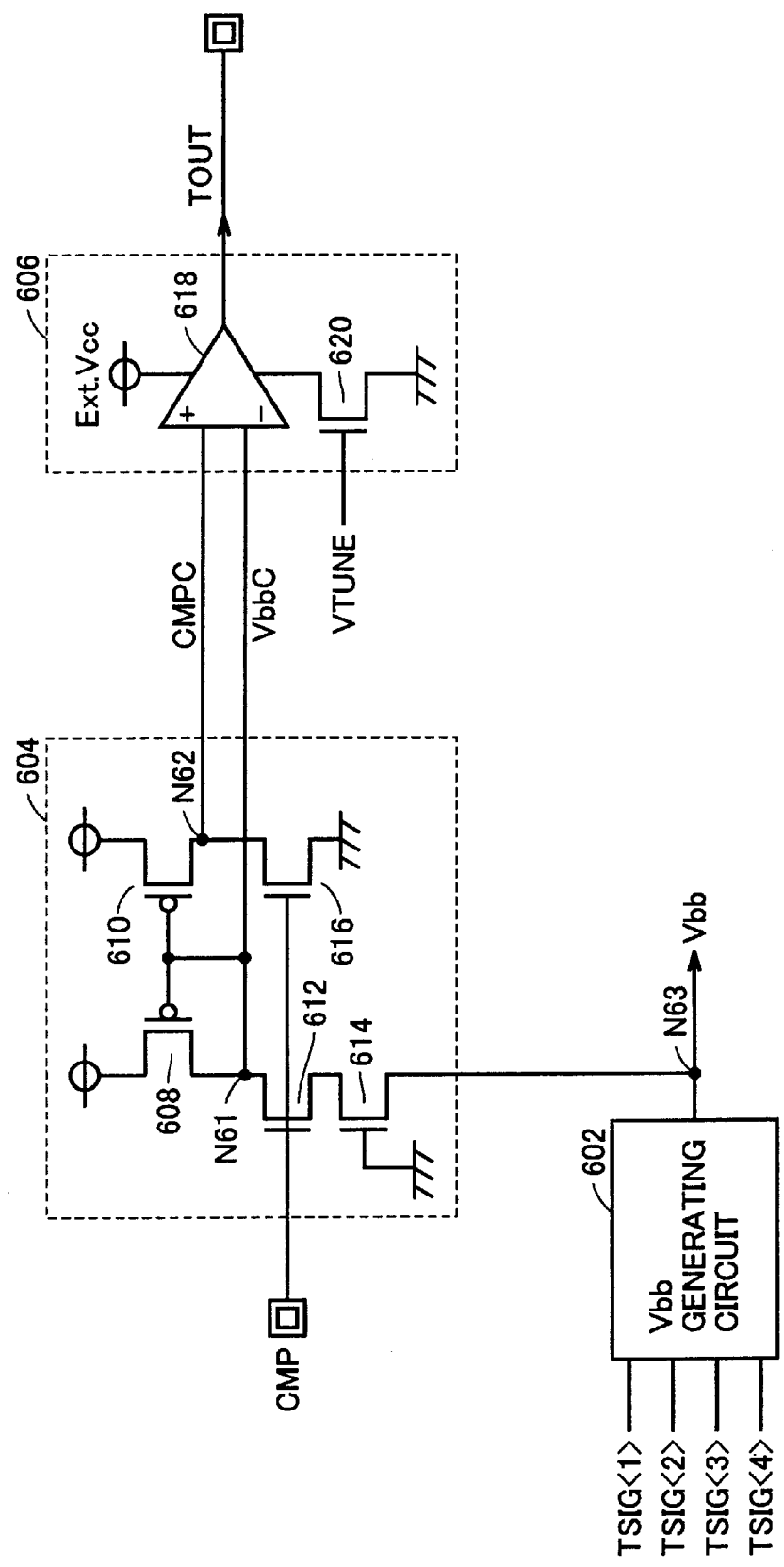
FIG. 33 shows a circuit configuration in which substrate potential Vbb is tuned using the level determining circuit.

FIG. 33 shows a circuit configuration for tuning the substrate potential Vbb using the level determining circuit.

Referring to FIG. 33, a Vbb generating circuit 602 is commonly mounted in a DRAM or the like, for internally generating a negative potential to be applied to a P well in which an N channel MOS transistor is formed. The potential Vbb output from Vbb generating circuit 602 to a node N63 can be changed in 16 steps by the tuning signal TSIG [4:1]. The potential Vbb and the externally input comparing potential CMP are applied to a Vbb comparing circuit 604. An output of Vbb comparing circuit 604 is applied to level determining circuit 606, and level determining circuit 606 provides test output signal TOUT.

Vbb comparing circuit 604 includes a P channel MOS transistor 608 connected between the power supply node and a node N61 and having its gate connected to node N61, and N channel MOS transistors 612, 614 connected in series between nodes N61 and N63. N channel MOS transistor 612 receives at its gate the potential CMP. N channel MOS transistor 614 has its gate connected to the ground node. Vbb comparing circuit 604 further includes a P channel MOS transistor 610 connected between the power supply node and a node N62 and having its gate connected to node N61, and an N channel MOS transistor 616 connected between node N62 and the ground node and receiving at its gate the comparing potential CMP. A signal CMPC is output from node N62, and a signal VbbC is output from node N61.

Level determining circuit 606 includes a comparing circuit 618 receiving external power supply potential Ext.Vcc as an operational power supply potential, comparing the signal CMPC with the signal VbbC and outputting the test output signal TOUT, and an N channel MOS transistor 620 connected between comparing circuit 618 and the ground node and turning on/off the operational current in response to the signal VTUNE.

In Vbb comparing circuit 604, the following relation holds. More specifically, when CMP=−Vbb, CMPC=VbbC, when CMP>−Vbb, CMPC>VbbC, and when CMP<−Vbb, CMPC<VbbC. The signal levels of CMPC and VbbC are converted to positive potentials to be within the input range of level determining circuit 606. The input range of level determining circuit 606 is a prescribed range between the external power supply potential Ext.Vcc and the ground potential.

By inputting the output signals CMPC and VbbC of Vbb comparing circuit 604 to level determining circuit 606, the tuning optimal value can be obtained in the similar manner as in the sixth embodiment. Further, by providing a circuit for drawing out charges at the output node of the potential Vbb for a prescribed time period as in the seventh embodiment, the tuning time can further be reduced.

When the potential Vbb that is a negative potential is to be compared with the externally applied comparing potential CMP, by using the Vbb comparing circuit 604 interposed, the value of the comparing potential CMP can be set to a positive value. Further, as the input to level determining circuit 606 also has a positive value, a common circuit configuration can be used for the level determining circuit 606.

Although the present invention has been described and illustrated in detail, it is clearly understood that the same is by way of illustration and example only and is not to be taken by way of Imitation, the spirit and scope of the present invention being limited only by the terms of the appended claims.

What is claimed is:

1. A semiconductor device, comprising:
   a terminal receiving an externally applied comparing potential;
   an internal potential generating circuit outputting an internal potential in accordance with setting;
   a level determining circuit determining whether said internal potential is appropriate or not with respect to said comparing potential; and
   an internal circuit operating upon reception of said internal potential.

2. The semiconductor device according to claim 1, wherein
   said setting is changed in accordance with an externally applied control signal, determined by said level determining circuit, and held in a non-volatile manner in said internal potential generating circuit.

3. The semiconductor device according to claim 1, further comprising
   a terminal for externally outputting a result of output of said level determining circuit.

4. The semiconductor device according to claim 1, further comprising:
   a capacitor connected to a node outputting said internal potential; and
   an initializing circuit for initializing potential of said node to a prescribed fixed potential.

5. The semiconductor device according to claim 1, wherein
   said internal potential is an intermediate potential between an externally applied power supply potential and a ground potential.

6. The semiconductor device according to claim 1, wherein
   said internal potential is a boosted potential higher than an externally applied power supply potential;
   said internal potential generating circuit includes a driving circuit for driving an output node to said boosted potential;
   said semiconductor device further comprising
   a first voltage converting circuit converting said boosted potential to a monitoring potential lower than said power supply potential and providing the converted potential to said level determining circuit.

7. The semiconductor device according to claim 6, wherein
   said driving circuit drives said output node toward said boosted potential when activated; and
   said internal potential generating circuit further includes
   a comparing circuit comparing an output of said first voltage converting circuit with a reference potential in accordance with said setting, for controlling activation of said driving circuit.

8. The semiconductor device according to claim 6, wherein
   said driving circuit boosts said output node toward said boosted potential when activated; and
   said internal potential generating circuit further includes
   a second voltage converting circuit receiving said boosted potential and outputting a potential lower than said power supply potential, and
   a comparing circuit comparing an output of said second voltage converting circuit with a reference potential in accordance with said setting for controlling activation of said driving circuit.

9. The semiconductor device according to claim 1, wherein
   said internal potential is a negative potential lower than the ground potential; and
   input range of said level determining circuit is within a range from said ground potential to a power supply potential;
   said semiconductor device further comprising
   a negative potential comparing circuit receiving said internal potential and said comparing potential, and outputting, to said level determining circuit, a signal for determination of which potential is within said input range.

* * * * *